US009064752B2

(12) United States Patent
Moon et al.

(10) Patent No.: US 9,064,752 B2
(45) Date of Patent: Jun. 23, 2015

(54) ARRAY SUBSTRATE FOR LIQUID CRYSTAL DISPLAY HAVING GATE LINE, GATE ELECTRODE AND DATA PATTERN IN AT LEAST TWO TRENCHES AND METHOD OF FABRICATING THE SAME

(71) Applicant: LG DISPLAY CO., LTD., Seoul (KR)

(72) Inventors: Tae-Hyoung Moon, Goyang-si (KR); Tae-Joon Song, Paju-si (KR); Kyu-Hwang Lee, Seoul (KR); Kyung-Ha Lee, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/096,932

(22) Filed: Dec. 4, 2013

(65) Prior Publication Data

US 2015/0001543 A1 Jan. 1, 2015

(30) Foreign Application Priority Data

Jun. 28, 2013 (KR) ........................ 10-2013-0075901

(51) Int. Cl.

| | |
|---|---|
| ***H01L 29/04*** | (2006.01) |
| ***H01L 29/10*** | (2006.01) |
| ***H01L 31/00*** | (2006.01) |
| ***H01L 27/14*** | (2006.01) |
| ***H01L 29/15*** | (2006.01) |
| ***H01L 31/036*** | (2006.01) |
| ***H01L 21/00*** | (2006.01) |
| ***H01L 21/84*** | (2006.01) |
| ***H01L 27/12*** | (2006.01) |
| ***G02F 1/1362*** | (2006.01) |

(52) U.S. Cl.

CPC ...... *H01L 27/1244* (2013.01); *G02F 1/136286* (2013.01); *G02F 2001/136295* (2013.01); *H01L 27/1259* (2013.01)

(58) Field of Classification Search

None

See application file for complete search history.

(56) References Cited

U.S. PATENT DOCUMENTS

| | | | | |
|---|---|---|---|---|
| 8,581,257 | B2 * | 11/2013 | Murai et al. | 257/59 |
| 2008/0314628 | A1 | 12/2008 | Song et al. | |
| 2009/0032819 | A1 * | 2/2009 | Lim et al. | 257/72 |
| 2009/0121228 | A1 * | 5/2009 | Kim et al. | 257/59 |
| 2009/0236627 | A1 | 9/2009 | Kim et al. | |
| 2012/0007091 | A1 | 1/2012 | Lee et al. | |

FOREIGN PATENT DOCUMENTS

JP 03085530 A 4/1991

OTHER PUBLICATIONS

Seung Jae Yun et al., "Planarized Thick Copper Gate Polycrystalline Silicon Thin Film Transistors for Ultra-Large AMOLED Displays", Electronic Materials Letters, vol. 8, No. 4 (2012), pp. 397-399.

* cited by examiner

*Primary Examiner* — Michael Jung

(74) *Attorney, Agent, or Firm* — McKenna Long & Aldridge LLP

(57) ABSTRACT

An array substrate includes: a trench having a depth from a surface of a substrate; a gate line, a gate electrode and a data pattern filling the respective trenches, wherein the data pattern is between the adjacent gate lines; a gate insulating layer on the gate line, the gate electrode and the data pattern, substantially flat over the substrate, and including contact holes that expose both ends of the data pattern, respectively; a data connection portion on the gate insulating layer and contacting the adjacent data patterns through the contact holes; a source electrode extending from the data connection portion, and a drain electrode spaced apart from the source electrode; a passivation layer on the source and drain electrodes and including a drain contact hole exposing the drain electrode; and a pixel electrode on the passivation layer and contacting the drain electrode through the drain contact hole.

16 Claims, 23 Drawing Sheets

ARRAY SUBSTRATE FOR LIQUID CRYSTAL DISPLAY HAVING GATE LINE, GATE ELECTRODE AND DATA PATTERN IN AT LEAST TWO TRENCHES AND METHOD OF FABRICATING THE SAME

The present invention claims the benefit of Korean Patent Application No. 10-2013-0075901, filed on Jun. 28, 2013, which is hereby incorporated by reference for all purposes as if fully set forth herein.

BACKGROUND OF THE INVENTION

1. Field of the Invention

The present invention relates to an array substrate for a liquid crystal display. More particularly, the present invention relates to an array substrate for a liquid crystal display and a method of fabricating the same.

2. Discussion of the Related Art

With the advent of a more information-oriented society, the field of display devices configured to process and display a large amount of information has rapidly developed. In particular, liquid crystal displays (LCDs) or organic light emitting diodes (OLEDs) have been developed as flat panel displays (FPDs) having excellent performance characteristics, such as a small thickness, light weight, and low power consumption, and has superseded conventional cathode-ray tubes (CRTs).

Among LCDs, an active matrix (AM)-type LCD including an array substrate having a TFT serving as a switching element capable of controlling on/off voltages of each of pixels may have excellent resolution and capability of embodying moving images.

Generally, the LCD is formed by fabricating an array substrate and a color filter substrate and interposing a liquid crystal layer between the array substrate and the color filter substrate.

FIG. 1 is an exploded perspective view illustrating an LCD or an OLED according to the related art.

Referring to FIG. 1, an array substrate 10 and a color filter substrate 20 are attached to each other with a liquid crystal layer 30 therebetween. The array substrate 10 includes a plurality of gate lines 14 and a plurality of data lines 16 to define a plurality of pixel regions P on a first substrate 12. A thin film transistor T is formed at the crossing portion of the gate and data lines 14 and 16 and is connected to a pixel electrode 18 in the pixel region P.

The color filter substrate 20 includes a black matrix 25 corresponding to the gate and data lines 14 and 16 and the thin film transistor T and surrounding the pixel region P, a color filter layer 26 including red (R), green (G) and blue (B) 26*a*, 26*b* and 26*c* arranged in the respective pixel regions P, and a common electrode 28on the black matrix 25 and the color filter layer 26.

Although not shown in the drawings, a sealant is formed between the array substrate 10 and the color filter substrate 20 to prevent leakage of liquid crystal, alignment layers are formed on inner surfaces of the array substrate 10 and the color filter substrate 20, respectively, and polarizers are located on outer surfaces of the array substrate 10 and the color filter substrate 20, respectively.

Moreover, a backlight unit is provided below the array substrate 10. A gate signal is sequentially supplied to the gate lines 14, then the corresponding thin film transistor T is turned on and a data signal is supplied to the data line 16 and then to the pixel electrode 18, and thus an electric field is produced between the pixel electrode 18 and the common electrode 28 to operate liquid crystal molecules of the liquid crystal layer 30, thereby displaying images.

FIG. 2 is a cross-sectional view illustrating an array substrate according to the related art.

Referring to FIG. 2, in the array substrate 10, a gate line (not shown) and a data line 16 cross each other to define a pixel region P, and a gate electrode 55 is formed in a switching region TrA of the pixel region P on a first substrate 11.

A gate insulating layer 58 is formed on the gate electrode 55, and a semiconductor layer 68 including an active layer 62 made of intrinsic amorphous silicon and an ohmic contact layer 66 made of impurity-doped amorphous silicon is formed on the gate insulating layer 58.

Source and drain electrodes 76 and 78 are spaced apart from each other and formed on the ohmic contact layer 66. The gate electrode 55, the gate insulating layer 58, the semiconductor layer 68 and the source and drain electrodes 76 and 78 form a thin film transistor Tr.

A passivation layer 82 is on the source and drain electrodes 76 and 78 and includes a drain contact hole 85 exposing the drain electrode 78. A pixel electrode 18 is formed on the passivation layer 82 in the pixel region P contacts the drain electrode 78 through the drain contact hole 85.

The gate line has a predetermined thickness and width, and the data line 16 has a predetermined thickness and width.

As the size of the LCD increases, the gate line and the data line become longer. This causes an increase of resistance in the signal line, and thus a signal delay occurs. Accordingly, signal deformation and operation defects are caused, and the display quality is degraded.

To prevent such a signal delay, the signal line is required to increase in thickness and/or width. However, in the case of an increase in width, aperture ratio is reduced. In the case of increase in thickness, a step portion becomes great, and this causes disconnection of a component over the signal line. Moreover, the step portion causes vacant space at sides of the signal line, insulation capability is degraded, and thus short-circuit between the signal line and a conductive component to be formed later may occur.

SUMMARY OF THE INVENTION

Accordingly, the present invention is directed to an array substrate for an LCD and a method of fabricating the same which substantially obviates one or more of the problems due to limitations and disadvantages of the related art.

An advantage of the present invention is to provide an array substrate for an LCD and a method of fabricating the same that can reduce signal delay and step portion with an increase of thickness of signal line.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an array substrate includes: a substrate including a pixel region; a trench having a depth from a surface of the substrate; a gate line, a gate electrode and a data pattern filling the respective trenches, wherein the data pattern is between the adjacent gate lines; a gate insulating layer on the gate line, the gate electrode and the data pattern, substantially flat over the substrate, and including contact holes that expose both ends of the data pattern, respectively;

a semiconductor layer on the gate insulating layer over the gate electrode; a data connection portion on the gate insulating layer and contacting the adjacent data patterns through the contact holes; a source electrode extending from the data connection portion and on the semiconductor layer, and a drain electrode spaced apart from the source electrode; a passivation layer on the source and drain electrodes and including a drain contact hole exposing the drain electrode; and a pixel electrode on the passivation layer and contacting the drain electrode through the drain contact hole.

In another aspect, an array substrate includes: a substrate including a pixel region; a buffer layer on the substrate and including a trench having a depth from a surface of the buffer layer; a gate line, a gate electrode and a data pattern filling the respective trenches, wherein the data pattern is between the adjacent gate lines; a gate insulating layer on the gate line, the gate electrode and the data pattern, substantially flat over the substrate, and including contact holes that expose both ends of the data pattern, respectively; a semiconductor layer on the gate insulating layer over the gate electrode; a data connection portion on the gate insulating layer and contacting the adjacent data patterns through the contact holes; a source electrode extending from the data connection portion and on the semiconductor layer, and a drain electrode spaced apart from the source electrode; a passivation layer on the source and drain electrodes and including a drain contact hole exposing the drain electrode; and a pixel electrode on the passivation layer and contacting the drain electrode through the drain contact hole.

In yet another aspect, a method of fabricating an array substrate includes: etching a substrate including a pixel region to form a trench having a depth from a surface of the substrate; forming a gate line, a gate electrode and a data pattern filling the respective trenches, wherein the data pattern is between the adjacent gate lines; forming a gate insulating layer on the gate line, the gate electrode and the data pattern, and the gate insulating layer being substantially flat over the substrate; forming a semiconductor layer on the gate insulating layer over the gate electrode; patterning the gate insulating layer to form contact holes that expose both ends of the data pattern, respectively; forming a data connection portion on the gate insulating layer and contacting the adjacent data patterns through the contact holes, a source electrode extending from the data connection portion and on the semiconductor layer, and a drain electrode spaced apart from the source electrode; forming a passivation layer on the source and drain electrodes and including a drain contact hole exposing the drain electrode; and forming a pixel electrode on the passivation layer and contacting the drain electrode through the drain contact hole.

In yet another aspect, a method of fabricating an array substrate includes: forming a buffer layer on a substrate including a pixel region; etching the buffer layer to form a trench having a depth from a surface of the buffer layer; forming a gate line, a gate electrode and a data pattern filling the respective trenches, wherein the data pattern is between the adjacent gate lines; forming a gate insulating layer on the gate line, the gate electrode and the data pattern, and substantially flat over the substrate; forming a semiconductor layer on the gate insulating layer over the gate electrode; patterning the gate insulating layer to form contact holes that expose both ends of the data pattern, respectively; forming a data connection portion on the gate insulating layer and contacting the adjacent data patterns through the contact holes, a source electrode extending from the data connection portion and on the semiconductor layer, and a drain electrode spaced apart from the source electrode; forming a passivation layer on the source and drain electrodes and including a drain contact hole exposing the drain electrode; and forming a pixel electrode on the passivation layer and contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
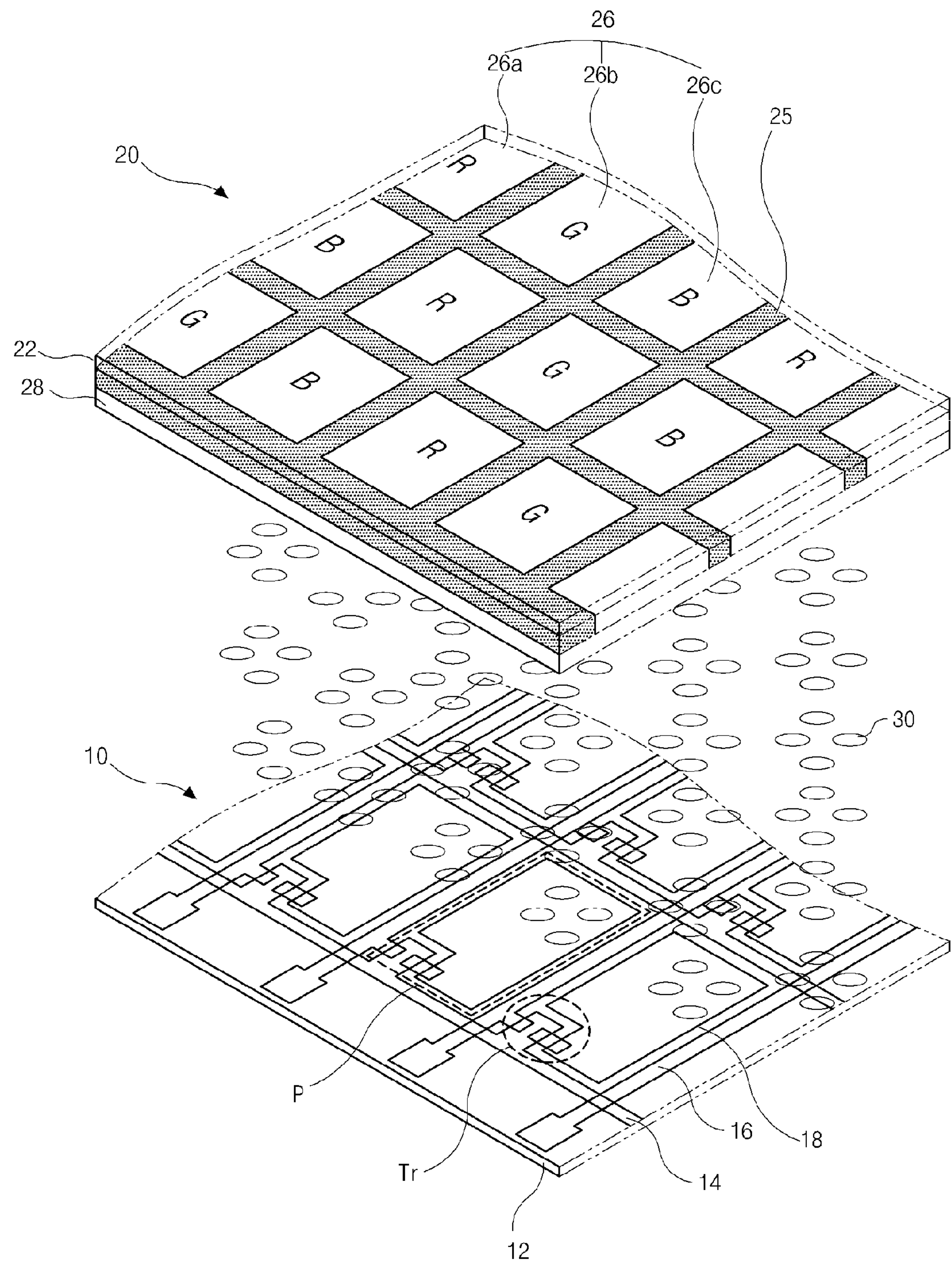
FIG. 1 is an exploded perspective view illustrating an LCD or an OLED according to the related art.
Figure 2:
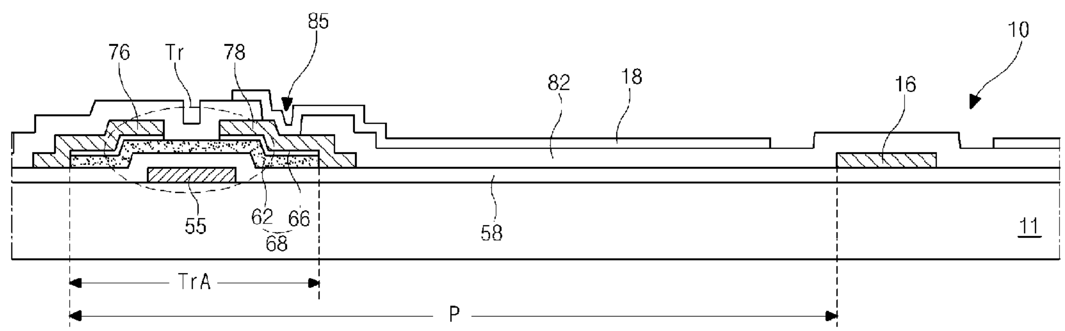
FIG. 2 is a cross-sectional view illustrating an array substrate according to the related art.
Figure 3:
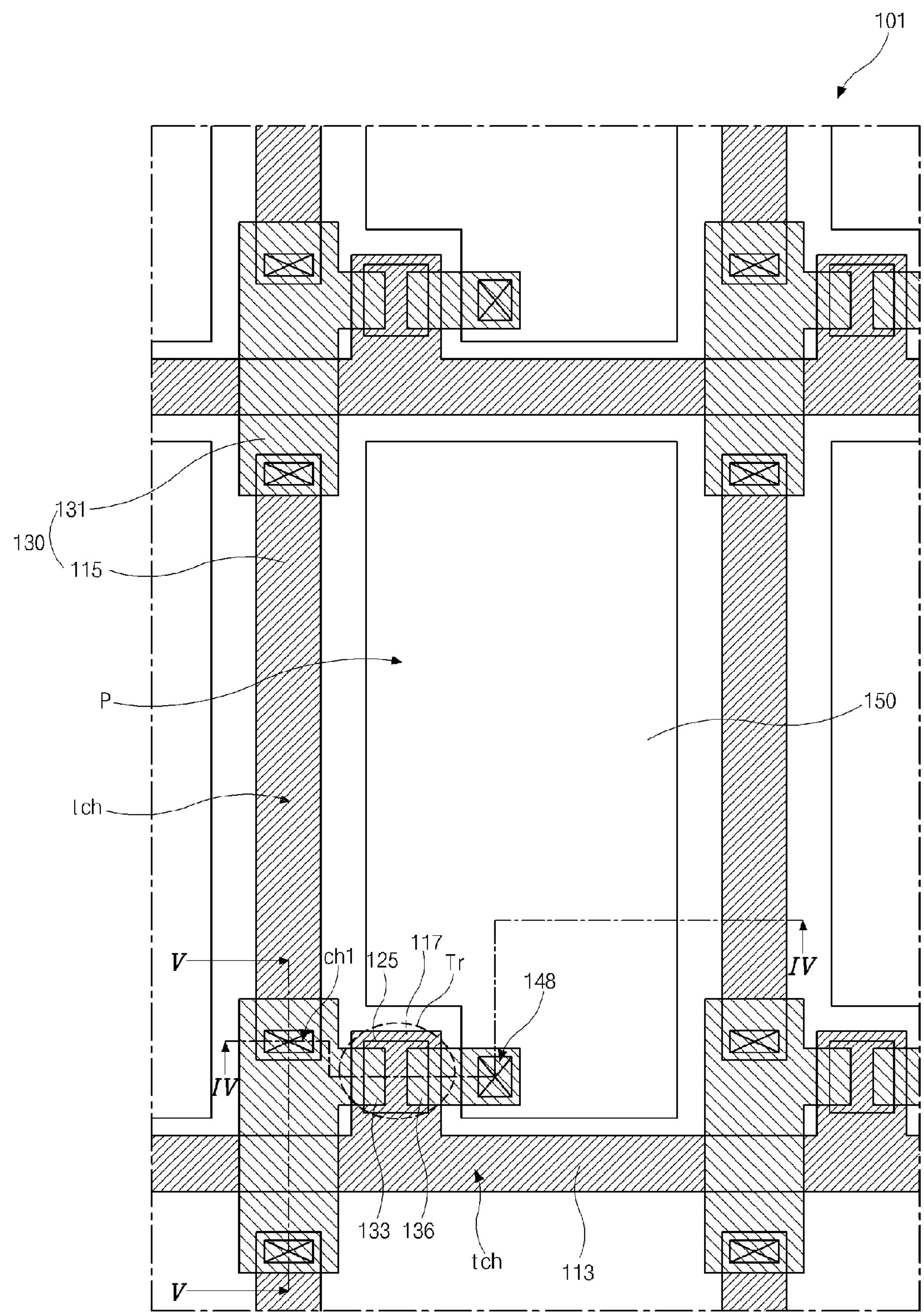
FIG. 3 is a plan view illustrating an array substrate of an LCD according to a first embodiment of the present invention.
Figure 4:
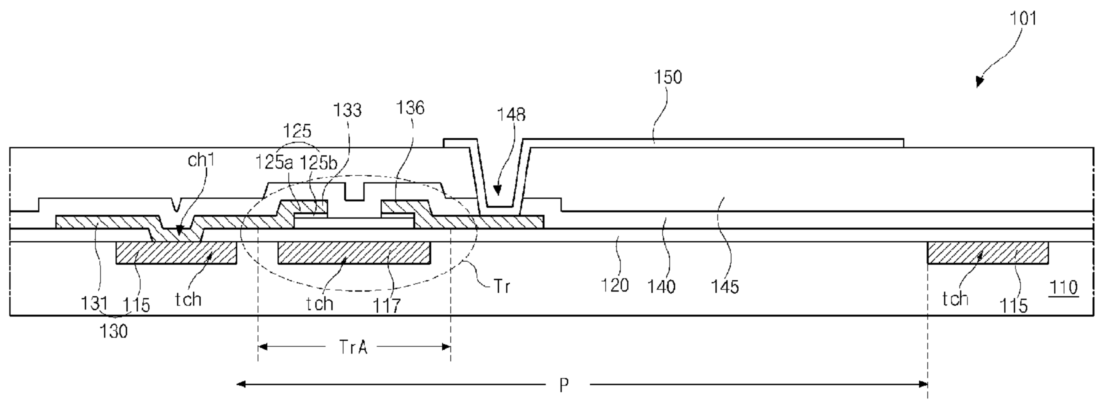
FIG. 4 is a cross-sectional view taken along a line, IV-IV of FIG. 3.
Figure 5:
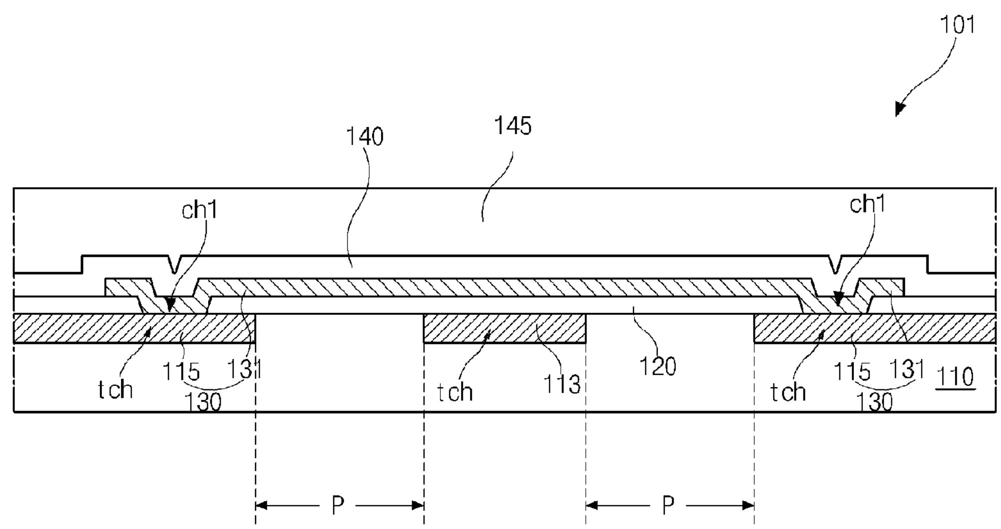
FIG. 5 is a cross-sectional view taken along a line, V-V of FIG. 3.

FIG. 3 is a plan view illustrating an array substrate of an LCD according to a first embodiment of the present invention, FIG. 4 is a cross-sectional view taken along a line, IV-IV of FIG. 3, and FIG. 5 is a cross-sectional view taken along a line, V-V of FIG. 3. For the purpose of explanation, a region where a thin film transistor Tr as a switching element is formed in a pixel region P is referred to as a switching region TrA.

Referring to FIGS. 3 to 5, trenches tch are formed in an insulation substrate 110 as a base of an array substrate 101. For example, the trenches tch are located at a region where a gate line 113 and a gate electrode 117 are formed, and a part, except for a crossing part of the gate line 113 and the data line 130 and a part to a predetermined distance from the crossing portion, out of a region where a data line 130 is formed.

It is preferred, but not required that the trench tch may have a depth of about 0.5 to 5 μm, and the trenches tch for the gate line 113 and the data line 130 may have respective widths which a gate line or data line of a common array substrate has.

In the substrate 110, the gate line 113, the gate electrode 117 and a data pattern 115 fill the respective trenches tch. The gate line 113, the gate electrode 117 and the data pattern 115 may have a single-layered structure made of the same material, for example, one of aluminum (Al), aluminum alloy (e.g., AlNd), copper (Cu) and copper alloy. The data pattern 115 is located between adjacent gate lines 113.

The gate line 113, the gate electrode 117 and the data pattern 115 may have a thickness which is the same as the depth of the trench tch. Accordingly, the surface of the gate line 113, the gate electrode 117 and a data pattern 115 may be substantially even with respect to the surface of the substrate 110.

Accordingly, even when the gate line 113, the gate electrode 117 and the data pattern 115 have a thickness much greater than that of the gate line and the data line of the related art, a step portion protruding upward from the surface of the substrate 110 is hardly formed. Thus, components to be formed later are not substantially affected by the gate line 113, the gate electrode 117 and the data pattern 115.

A gate insulating layer 120 is formed on the entire surface of the substrate 110 having the gate line 113, the gate electrode 117 and the data pattern 115 therein. The gate insulating layer 120 may be made of an inorganic insulating material, for example, silicon oxide ($SiO_2$) or silicon nitride (SiNx).

The gate insulating layer 120 is substantially even because the surface of the substrate therebelow having the gate line 113, the gate electrode 117 and the data pattern 115 is substantially even. The gate insulating layer 120 has first contact holes ch1 exposing ends of the data pattern 115.

A semiconductor layer 125 is formed on the gate insulating layer in the switching region TrA corresponding to the gate electrode 117.

The semiconductor layer 125 includes an active layer 125*a* made of intrinsic amorphous silicon, and an ohmic contact layer 125*b* made of impurity-doped amorphous silicon exposing a center portion of the active layer 125*a*.

A data connection portion 131, and source and drain electrodes 133 and 136 are formed on the gate insulating layer 120 and the semiconductor layer 125. The data connection portion 131, and the source and drain electrodes 133 and 136 may have a single-layered or multi-layered structure using at least one of aluminum (Al), aluminum alloy (e.g., AlNd), copper (Cu), copper alloy, molybdenum (Mo), and molybdenum alloy (e.g., MoTi). The data connection portion 131 may be a data connection pattern, for example. The data connection portion 131 overlaps the adjacent data patterns 115 at both sides thereof and the gate line 113, and contacts the data patterns 115 at both sides thereof through the first contact holes ch1. The source electrode 133 is connected to the data connection portion 131. More particularly, the source electrode 133 extends from the data connection portion 131 and is located on the ohmic contact layer 125*b*. The drain electrode 136 is spaced apart from the source electrode 133 and located on the ohmic contact layer 125*b*.

The data patterns 115 formed at the trenches tch and the data connection portion 131 form the data line 130 extending along a direction crossing the gate line 113.

The gate electrode 117, the gate insulating layer 120, the semiconductor layer 125, and the source and drain electrodes 133 and 136 form the thin film transistor Tr.

A passivation layer is formed on the data connection portion 131 and the source and drain electrodes 133 and 136. The passivation layer includes a drain contact hole 148 exposing the drain electrode 136.

The passivation layer may be a single-layered structure using inorganic insulating material or organic insulating material, or a double-layered structure made using inorganic insulating material and organic insulating material. In this embodiment, for the purpose of explanation, the passivation layer has a double-layered structure with a first layer 140 made of inorganic insulating material, and a second layer 145 made of organic insulating material and thus having an even surface.

In this regard, when the active layer 125*a* contacts organic insulating material, a channel portion of the active layer 125*a* is contaminated by the organic insulating material, and thus a property of the thin film transistor Tr may be degraded. To prevent this problem, the first layer 140 of inorganic insulating material is first formed and then the second layer 145 of organic insulating material is formed thereon.

Further, using the second layer 145 of organic insulating material may be advantageous to operation of particular LCDs. In this regard, among various modes of LCDs such as twisted nematic (TN) mode, in-plane switching mode, fringe field mode, etc., the in-plane switching mode LCD and fringe field mode LCD prefer a pixel electrode formed on an flat surface for uniformity and efficiency of production of electric field, and in consideration of this, the second layer 145 is employed to produce a flat surface.

A pixel electrode 150 is formed on the second layer 145 and contacts the drain electrode 136 through the drain contact hole 148. The pixel electrode 150 may be made of a transparent conductive material, for example, indium-tin-oxide (ITO) or indium-zinc-oxide (IZO).

However, the passivation layer can be omitted. And in this case, the pixel electrode 150 can be formed on, e.g., drain electrode 136 and connected to the drain electrode 136.

The pixel electrode 150 may have a plate shape in the pixel region P, and in this case, the array substrate 110 may be used as an array substrate for a twisted nematic mode LCD.

However, the pixel electrode 150 may have other shapes according to the modes of LCDs. For example, in a case that the array substrate 101 is used for an in-plane switching mode LCD, the pixel electrode 150 may be configured to have a plurality of bars spaced apart from one another, and a common electrode may be configured to have a plurality of another bars alternating with the bars of the pixel electrode 150 to produce an in-plane electric field. In this case, the common electrode is connected to a common line, and the common line may be formed in the substrate 110 filling a corresponding trench that is spaced apart from and parallel with the gate line 113.

Alternatively, in a case that the array substrate 110 is used for a fringe field mode LCD, the pixel electrode 150 may be configured to have a plate shape, and a common electrode may be configured to have a plurality of bar-shaped openings to produce an in-plane electric field. In this case, the common electrode may be formed over the pixel electrode 150 with an insulating layer therebetween.

As described above, because of the trench tch, the array substrate 101 can use the gate line 113 and the data line 130 several times to tens of times thicker than those of the related art. Accordingly, even when display area increases and the signal line becomes longer, thickness increases and thus resistance is reduced. Therefore, signal delay can be prevented.

Moreover, even when the thickness of the gate line 113 and the data line 130 increases, a step portion due to this is not produced. Accordingly, disconnection of a component over the signal line or a vacant space near the signal line due to the step portion is prevented. Therefore, product defect rate and production cost can be reduced.

Figure 6:
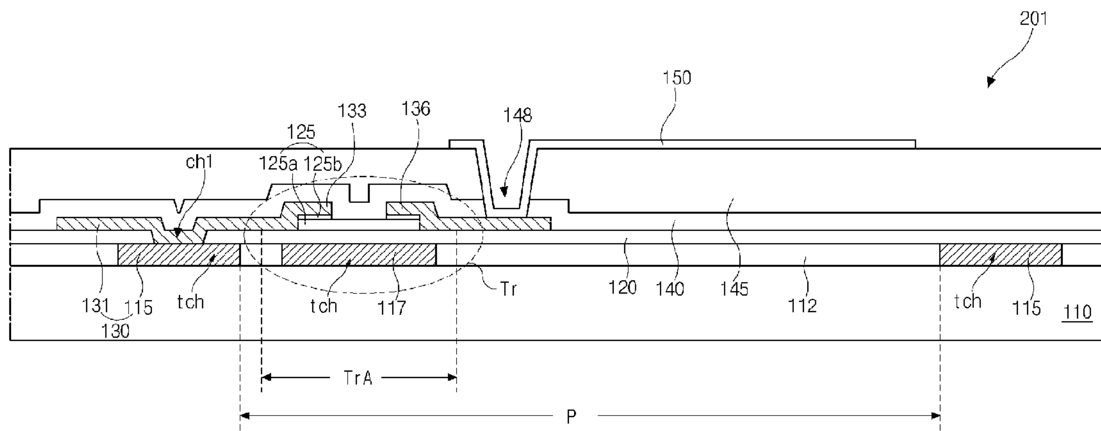
FIG. 6 is a cross-sectional view illustrating an array substrate of an LCD according to a second embodiment of the present invention.

FIG. 6 is a cross-sectional view illustrating an array substrate of an LCD according to a second embodiment of the present invention.

The array substrate 202 of the second embodiment is similar to the array substrate 101 of the first embodiment but is different in the trench tch. Explanation of parts similar to parts of the first embodiment may be omitted.

The trench tch of the first embodiment is formed in the substrate 110 while the trench tch of the second embodiment is formed in a buffer layer 112 on the substrate 110. The buffer layer 112 may be made of inorganic or organic insulating material.

A gate line 113, a gate electrode 117 and a data pattern 115 fill the corresponding trenches tch in the buffer layer 112. The surface of the gate line 113, the gate electrode 117 and the data pattern 115 may be substantially even with respect to the surface of the buffer layer 112.

The trench tch may be configured to open the surface of the substrate 110 therebelow. Alternatively, the trench tch may be configured to have a depth less than a thickness of the buffer layer 112.

The layered structure over the gate line 113, the gate electrode 117 and the data pattern 115 is similar to that of the first embodiment.

The array substrate 201 of the second embodiment can have the same advantages as that of the first embodiment 101.

Methods of fabricating the array substrates according to the first and second embodiments are explained as below.

FIGS. 7A to 7G are plan views illustrating a method of the array substrate of the LCD according to the first embodiment, FIGS. 8A to 8K are cross-sectional views taken along a line VIII-VIII of FIGS. 7A to 7G, and FIGS. 9A to 9K are cross-sectional views taken along a line IX-IX of FIGS. 7A to 7G.

Figure 7A:
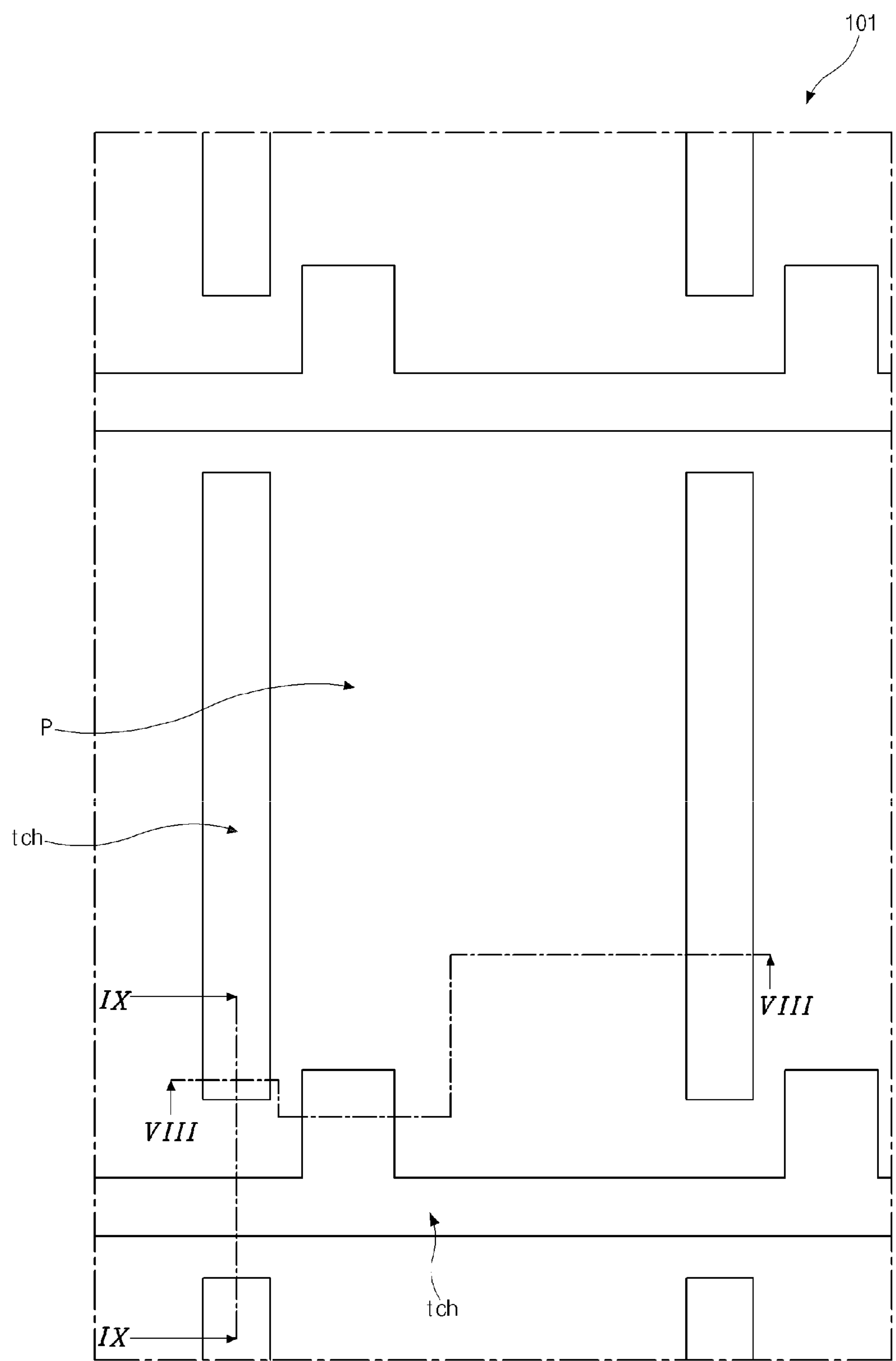
FIGS. 7A to 7G are plan views illustrating a method of fabricating the array substrate of the LCD according to the first embodiment.
Figure 8A:
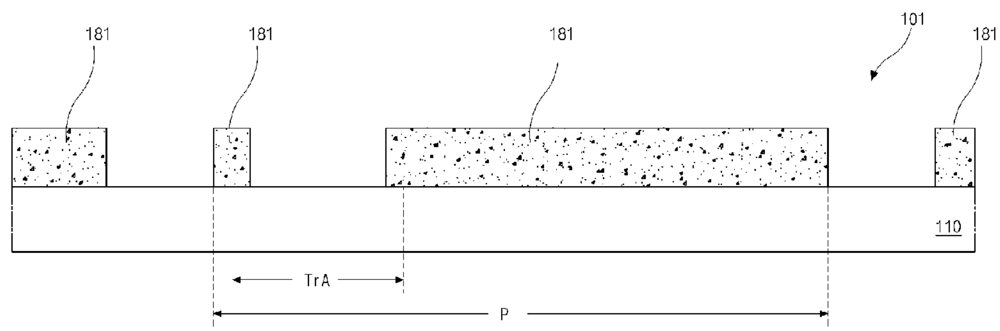
FIGS. 8A to 8K are cross-sectional views taken along a line VIII-VIII of FIGS. 7A to 7G.
Figure 9A:
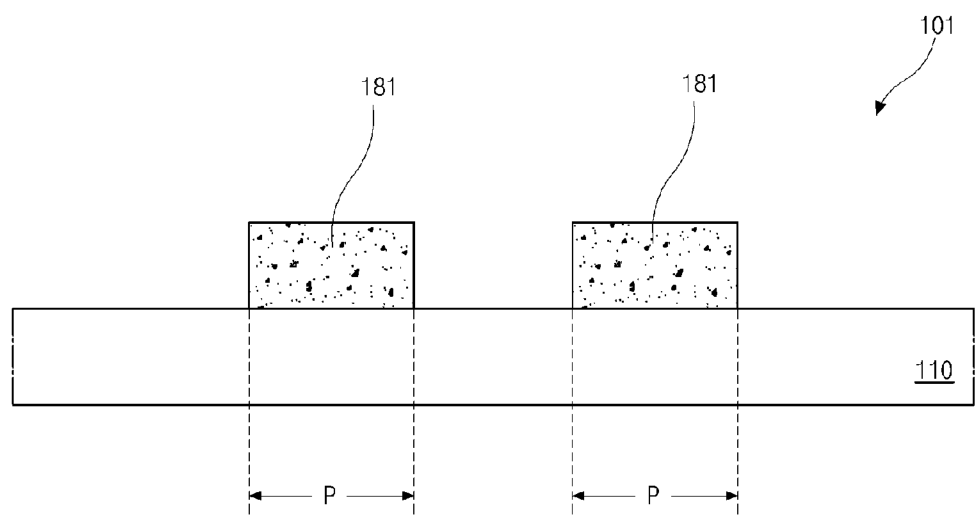
FIGS. 9A to 9K are cross-sectional views taken along a line IX-IX of FIGS. 7A to 7G.

Referring to FIGS. 7A, 8A and 9A, a first photoresist layer is formed on a substrate 110 which is made of, for example, glass or plastic, and then light exposure and developing are performed to form a first photoresist pattern 181 at regions except for regions where a gate line 113, a gate electrode 117 and a data pattern 115 are formed. In other words, the first photoresist pattern 181 exposes the regions where the gate line 113, the gate electrode 117 and the data pattern 115 are formed.

Figure 8B:
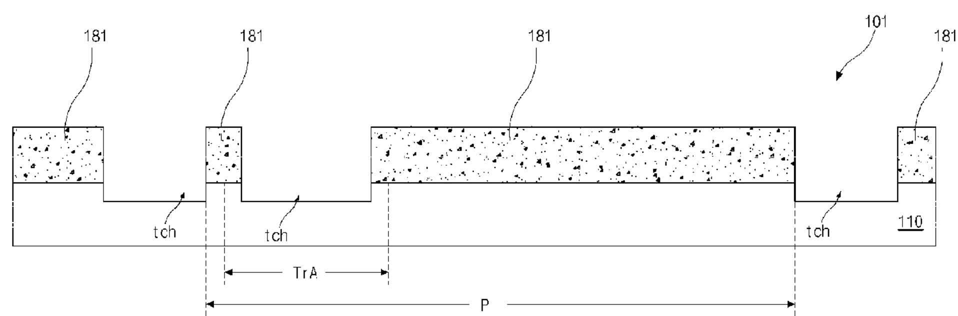
Figure 9B:
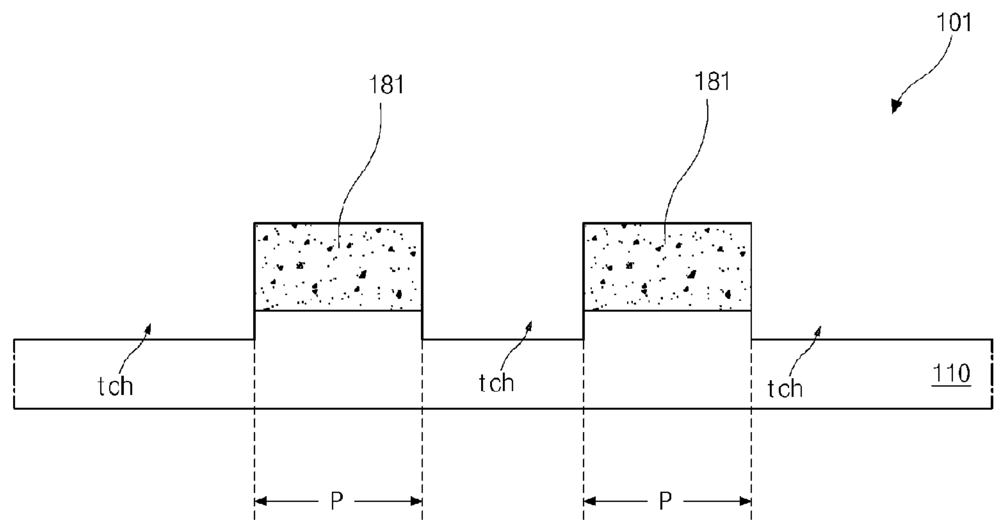

Referring to FIGS. 7A, 8B and 9B, the substrate 110 is etched using the first photoresist pattern 181 to form trenches tch. The trench tch may have a width of about 5 μm to about 15 μm and a depth 0.5 μm to 5 μm.

The trench tch corresponding to the gate line 113 extends without disconnection along a first direction that is an extension direction of the gate line 113. The trench tch corresponding to the data pattern 115 extends along a second direction crossing the first direction and is separated with respect to each trench tch for the gate line 113.

Figure 8C:
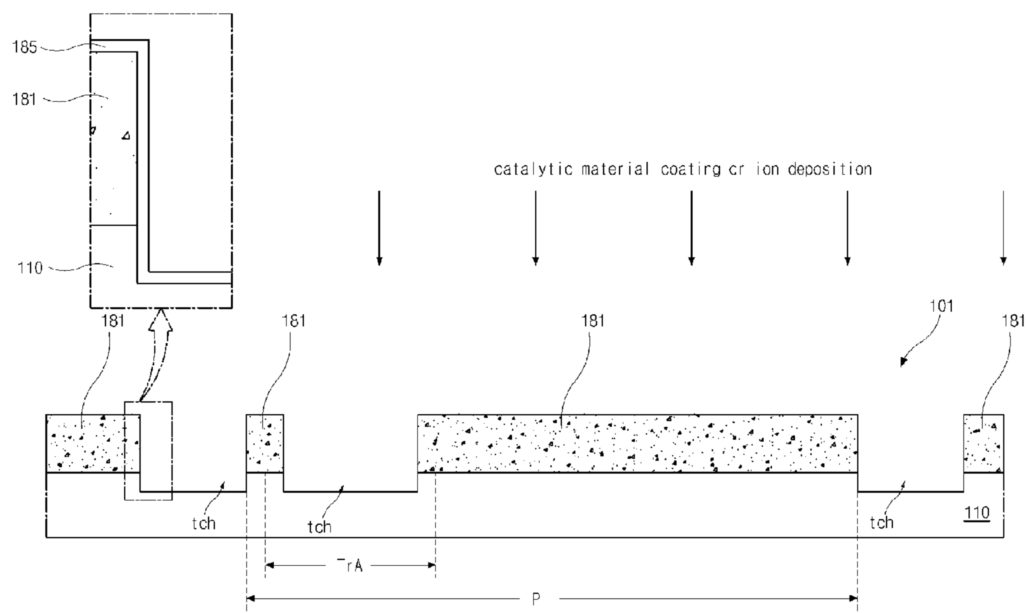
Figure 9C:
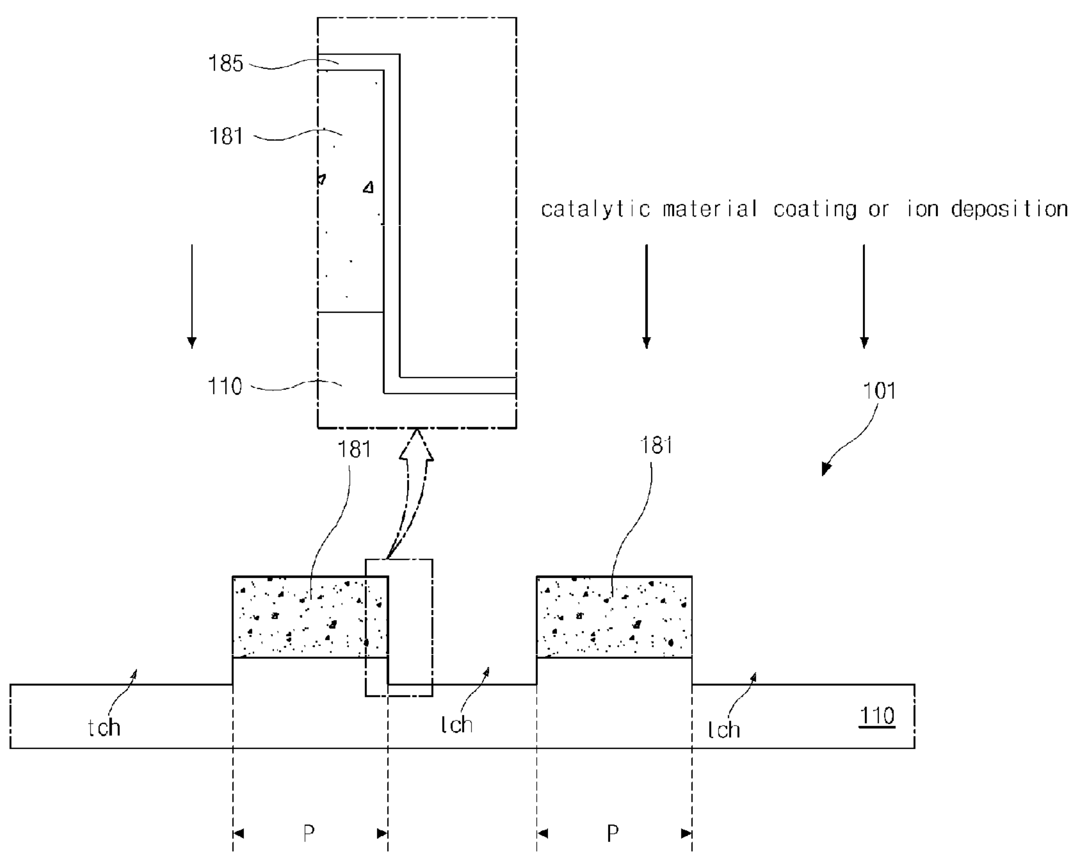

Referring to FIGS. 7A, 8C and 9C, a catalytic layer 185 is formed entirely on the substrate 110 having the first photoresist pattern 181. For example, the catalytic layer 185 may be made of palladium (Pd) group material, and may be formed by coating Pd—Sn colloid or depositing Pd ion (e.g., $Pd^{2+}$).

Figure 8D:
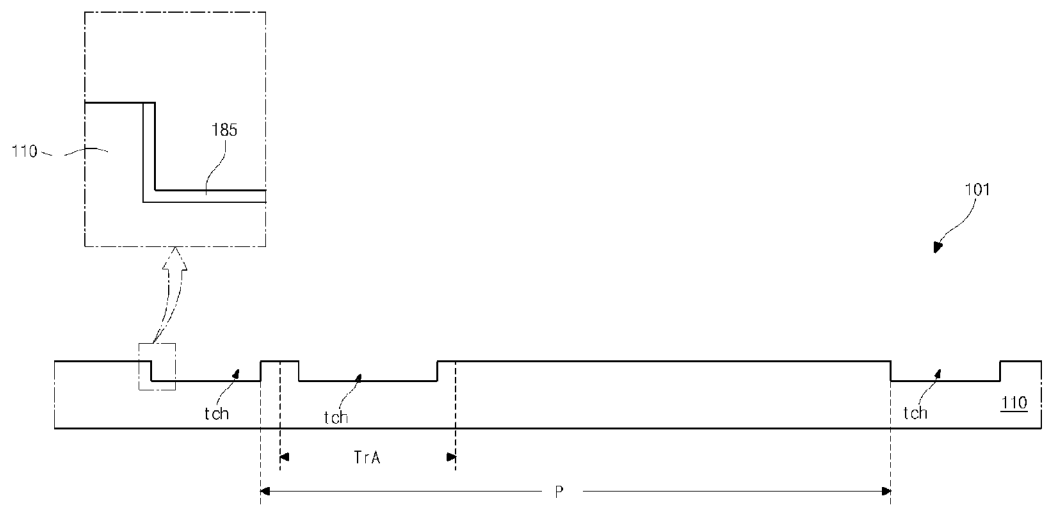
Figure 9D:
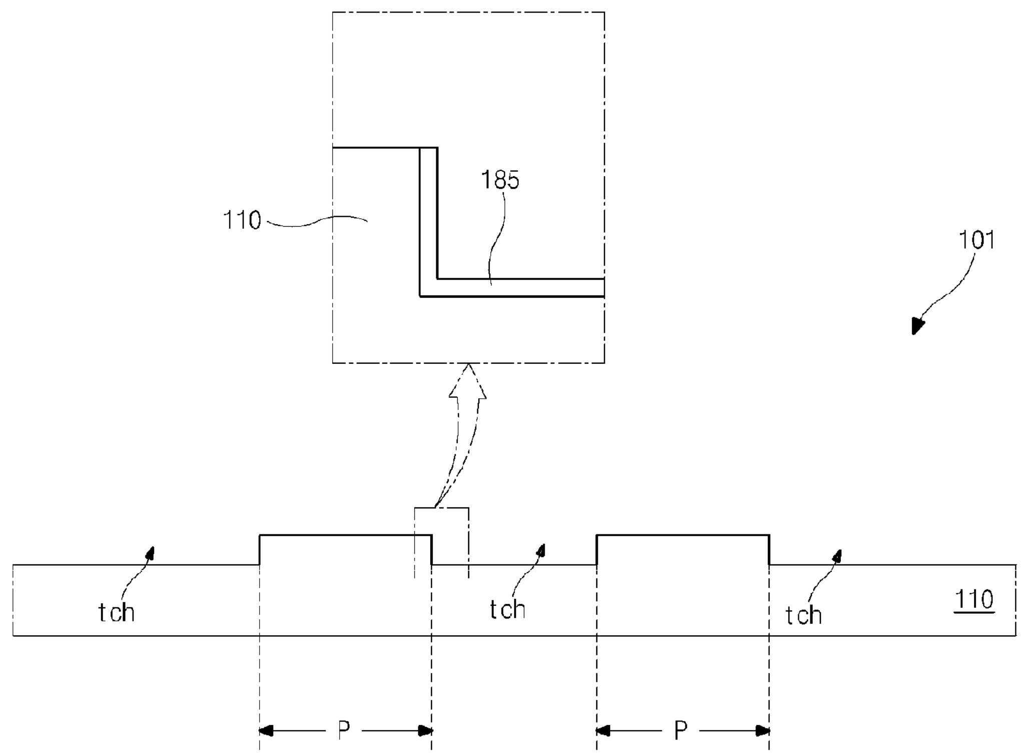

Referring to FIGS. 7A, 8D and 9D, a stripping process is performed to remove the first photoresist layer 181.

Accordingly, the catalytic layer 185 on the first photoresist pattern 181 is removed, and thus the catalytic layer 185 remains on an inner surface of the trench tch, and the surface of the substrate 110 outside the trench tch is exposed without the catalytic layer 185 thereon.

Figure 7B:
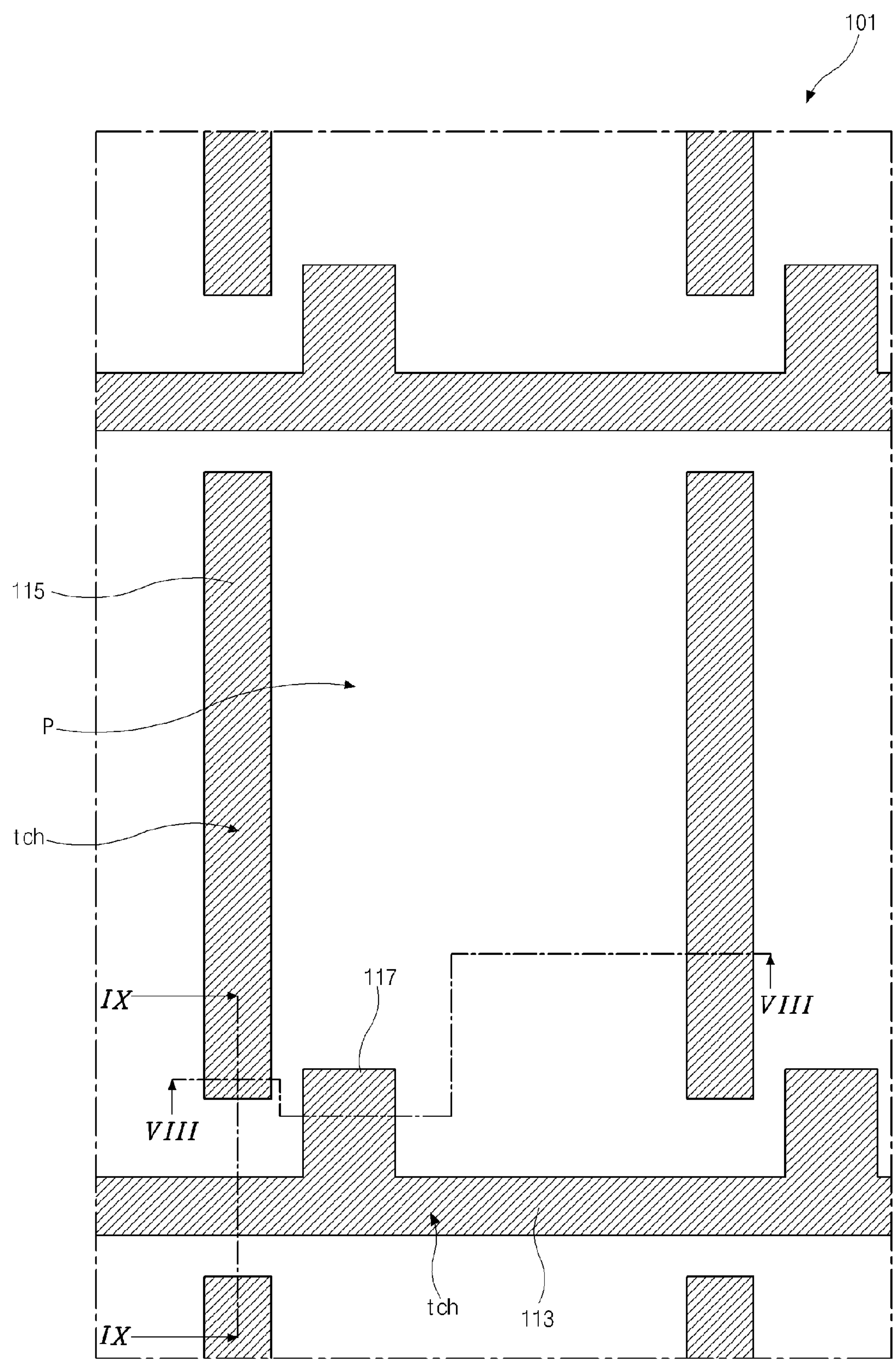
Figure 8E:
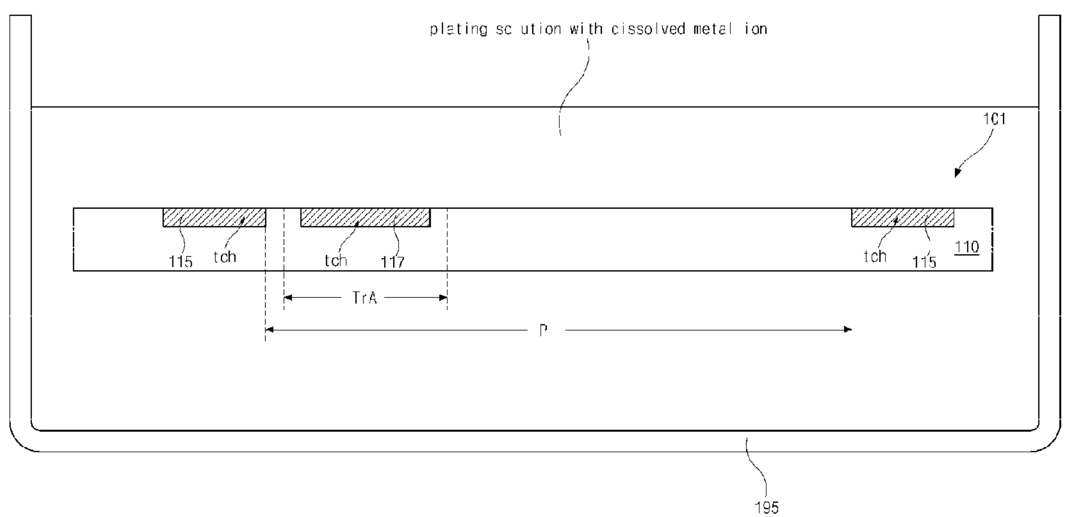
Figure 9E:
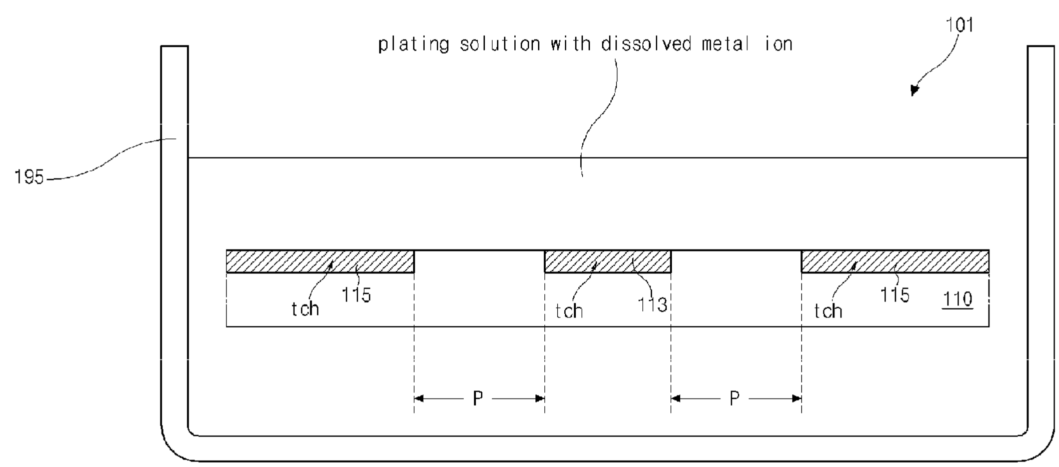

Referring to FIGS. 7B, 8E and 9E, the substrate 110 having the catalytic layer 185 in the trench tch is immersed in a tank 195 containing a plating solution in which at least one metal material of low resistance, for example, at least one of aluminum (Al), aluminum alloy, copper and copper alloy ion is dissolved, and electroless plating is performed.

Through the electroless plating, metal ion is selectively plated in the trench tch having the catalytic layer 185 therein but is not plated on the surface of the substrate 110 not having the catalytic layer 185.

Accordingly, when the electroless plating is finished, the gate line 113, the gate electrode 117 and the data pattern 115 are formed filling the corresponding trenches tch.

Figure 8F:
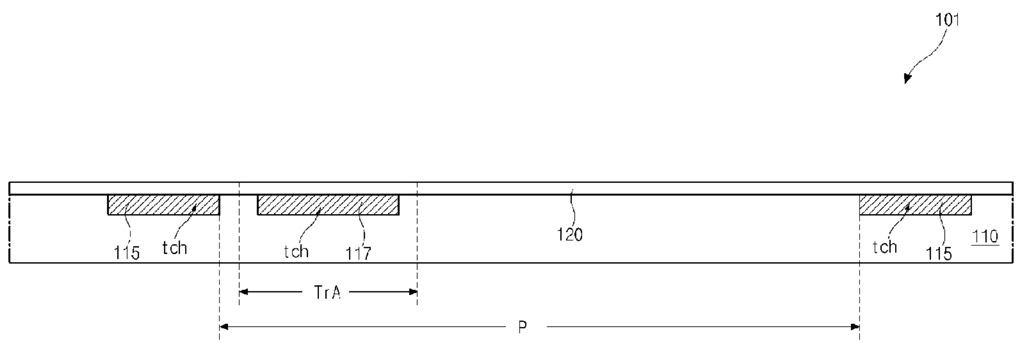
Figure 9F:
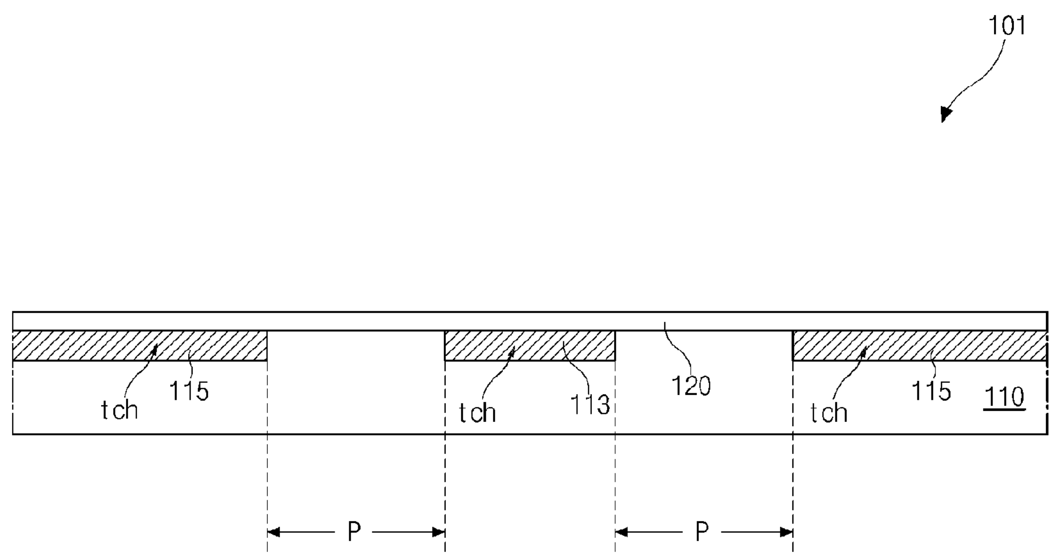

Referring to FIGS. 7B, 8F and 9F, a gate insulating layer 120 is formed entirely on the substrate 110 having the gate line 113, the gate electrode 117 and the data pattern 115. The gate insulating layer 120 may be made of inorganic insulating material, for example, silicon oxide ($SiO_2$) or silicon nitride (SiNx).

The gate insulating layer 120 is substantially flat without a step portion on the substrate 110 because the surface of the gate line 113, the gate electrode 117 and the data pattern 115 below the gate insulating layer is substantially even with the surface of the substrate 110.

Figure 7C:
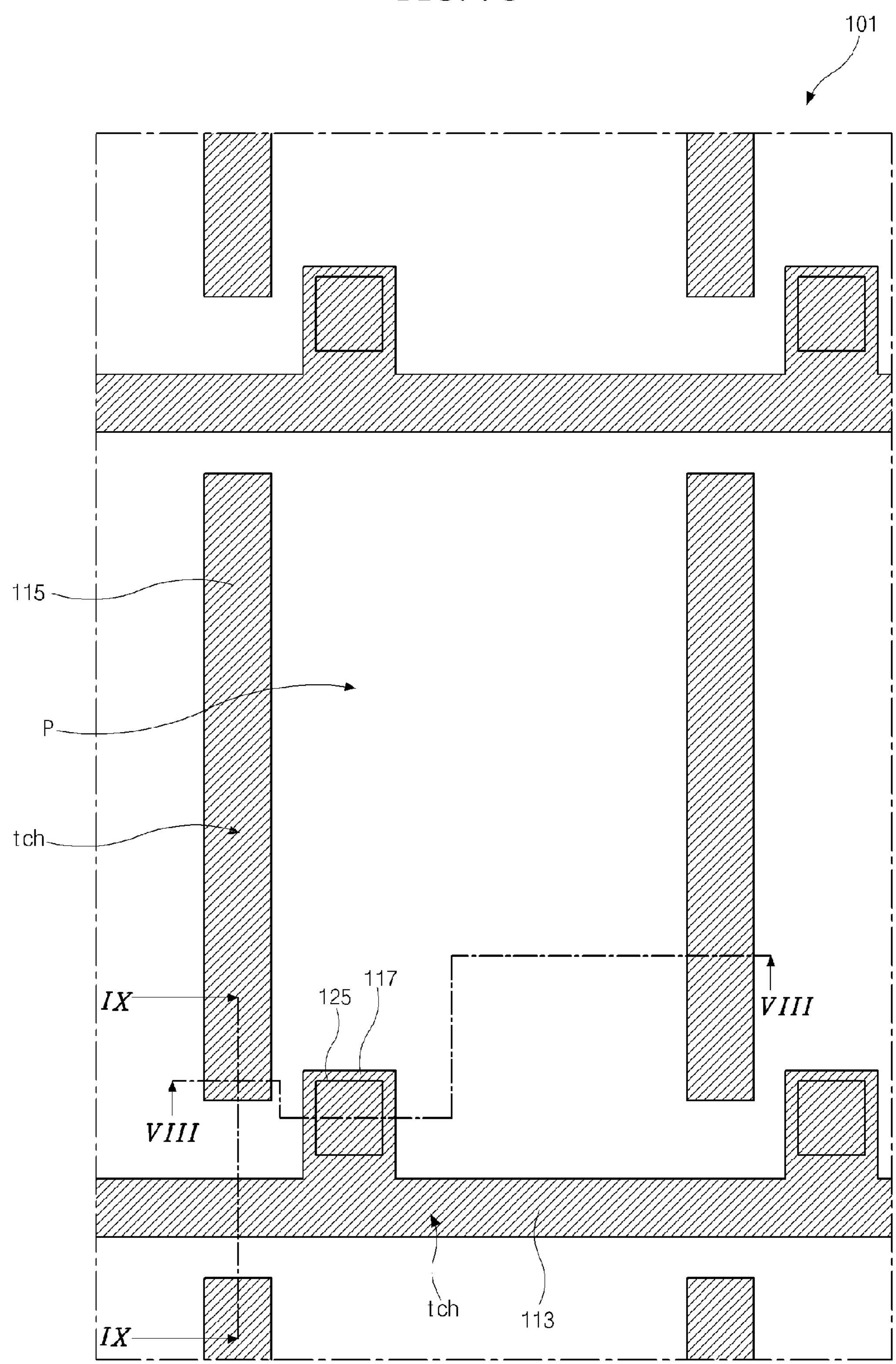
Figure 8G:
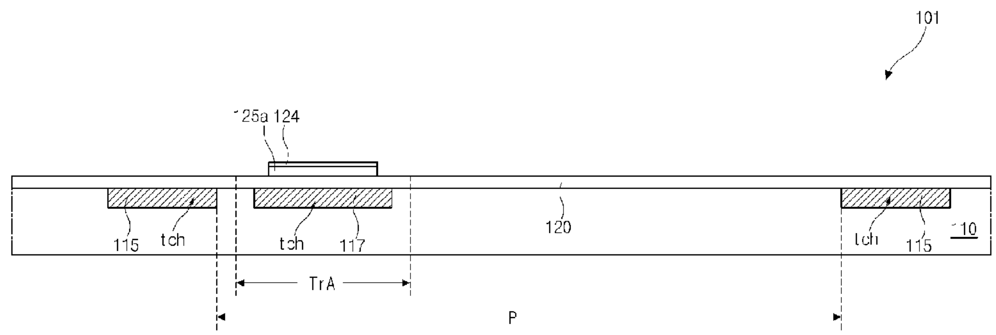
Figure 9G:
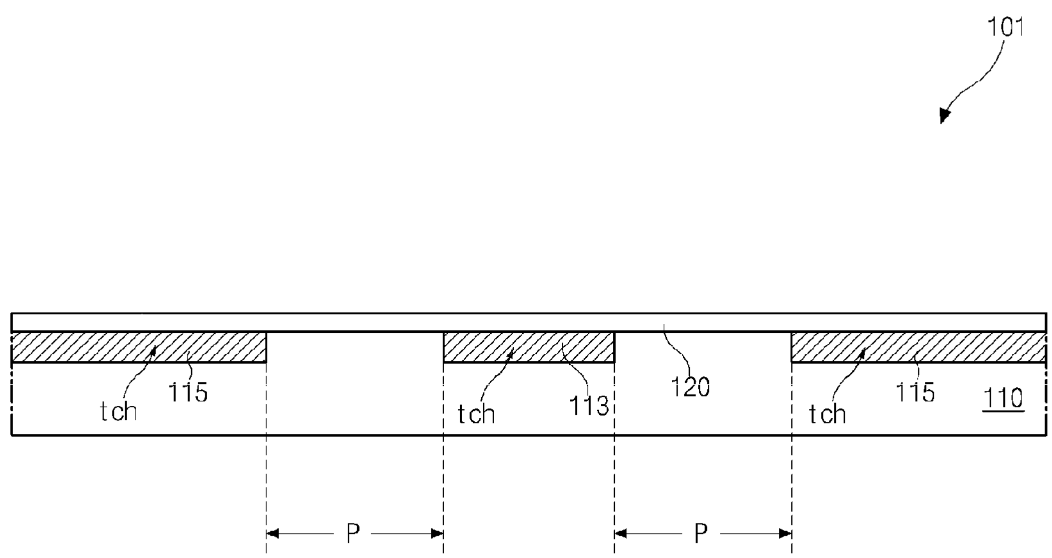

Referring to FIGS. 7C, 8G and 9G, intrinsic amorphous silicon layer and impurity-doped amorphous silicon layer are formed on the gate insulating layer 120, and then a mask process is performed to form an active layer **125*a* and an impurtity-doped amorphous silicon pattern 124 on the active layer 125*a***.

Figure 7D:
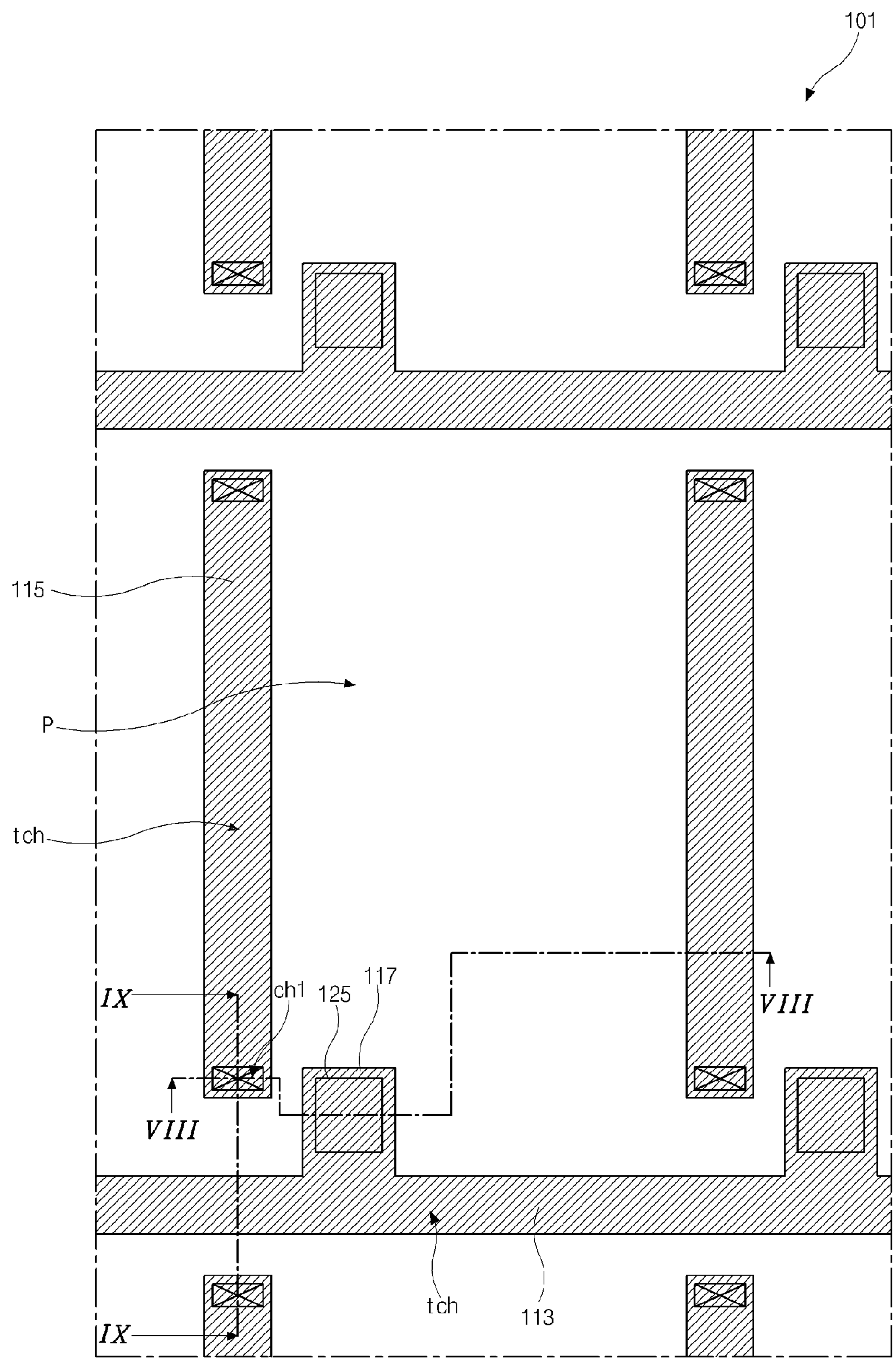
Figure 8H:
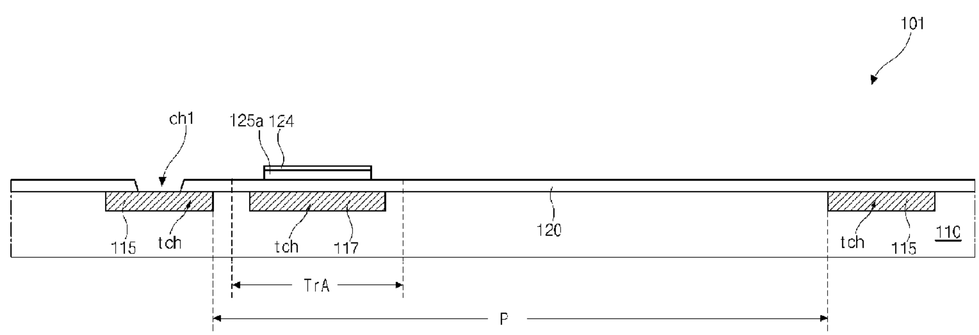
Figure 9H:
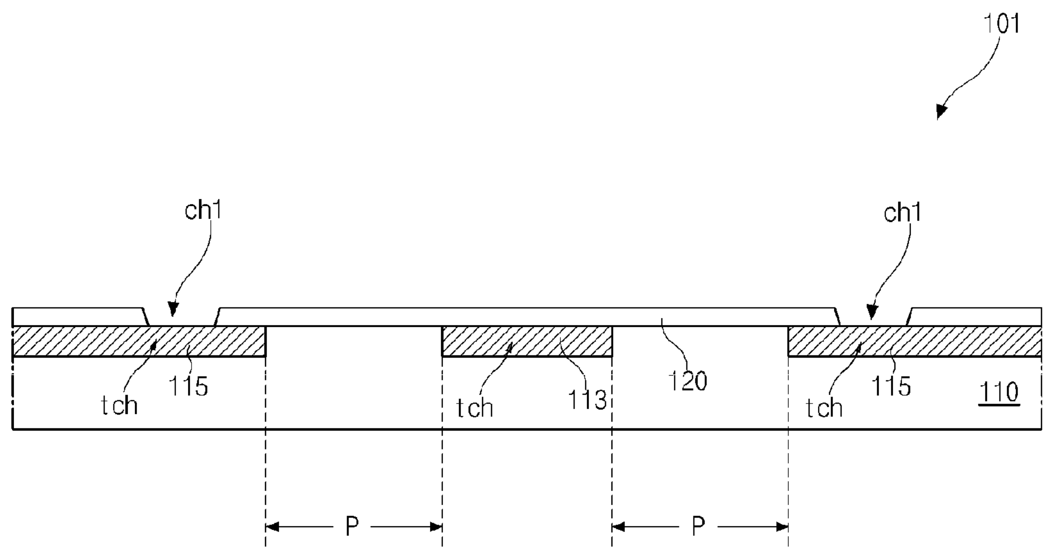

Referring to FIGS. 7D, 8H and 9H, a mask process is performed for the substrate 110 having the active layer **125*a* and the imputiry-doped amorphous silicon pattern 124 to remove portions of the gate insulating layer 120 corresponding to ends of the data pattern 115 and form a first contact hole ch1 exposing each of both ends of the data pattern 115**.

Figure 7E:
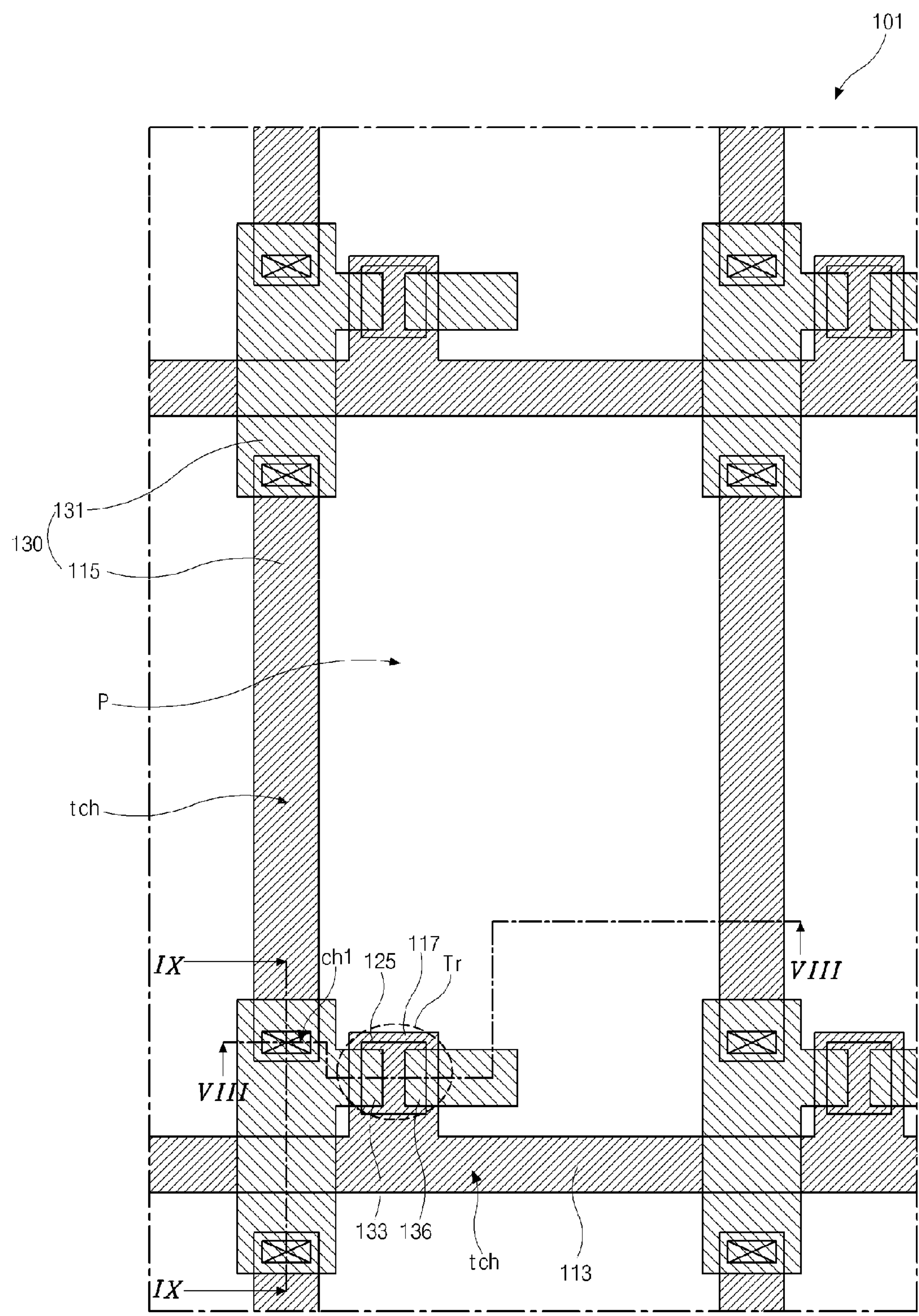
Figure 8I:
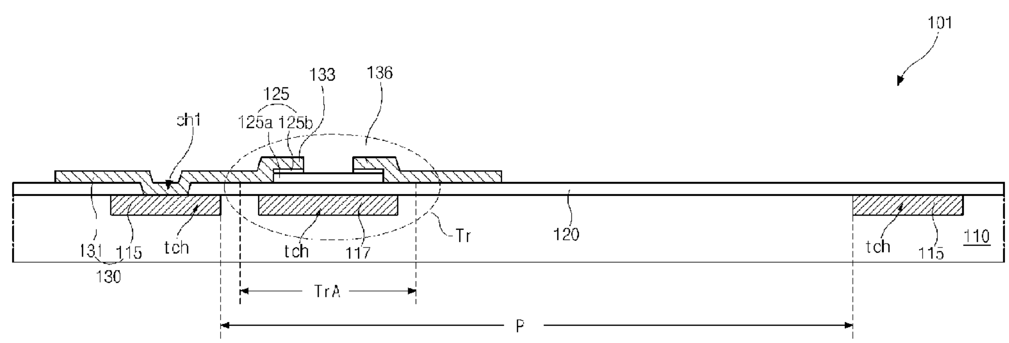
Figure 9I:
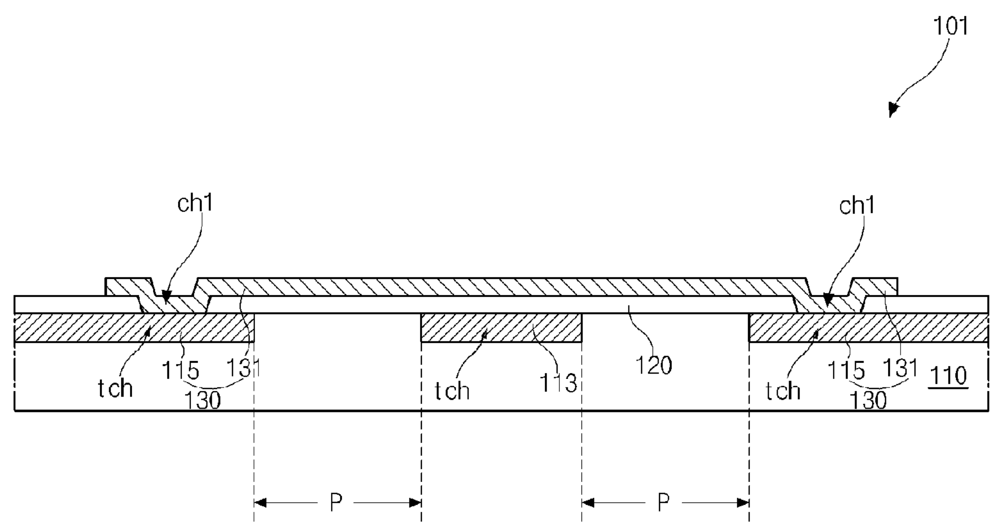

Referring to FIG. 7E, 8I and 9I, a second metal layer is formed on the substrate 110 having the first contact hole ch1. The second metal layer may be formed by depositing at least one from a metal material group including aluminum (Al), aluminum alloy, copper, copper alloy, molybdenum and molybdenum alloy.

A mask process is performed for the second metal layer to form a data connection portion 131, and source and drain electrodes 133 and 136. The data connection portion 131 crosses the corresponding gate line 113, and contacts the data patterns 115 at both sides thereof through the respective first contact hole ch1 to connect the data patterns 115. The source electrode 133 branches off from the data connection portion 131, and the drain electrode 136 is spaced apart from the source electrode 133. The source and drain electrodes 133 and 136 are formed on the impurity-doped amorphous silicon pattern 124.

The data pattern 115 and the data connection portion 131 are alternated and connected along the second direction to form each data line 130.

Then, a portion of the impurity-doped amorphous silicon pattern 124 exposed between the source and drain electrodes 133 and 136 are removed to form an ohmic contact layer **125*b* below each of the source and drain electrodes 133 and 136 and expose a center portion of the active layer 125*a***.

The active layer **125*a* and the ohmic contact layer 125*b* form a semiconductor layer 125. The gate electrode 117, the gate insulating layer 120, the semiconductor layer 125 and the source and drain electrodes 133 and 136** in the switching region TrA form a thin film transistor Tr.

Figure 7F:
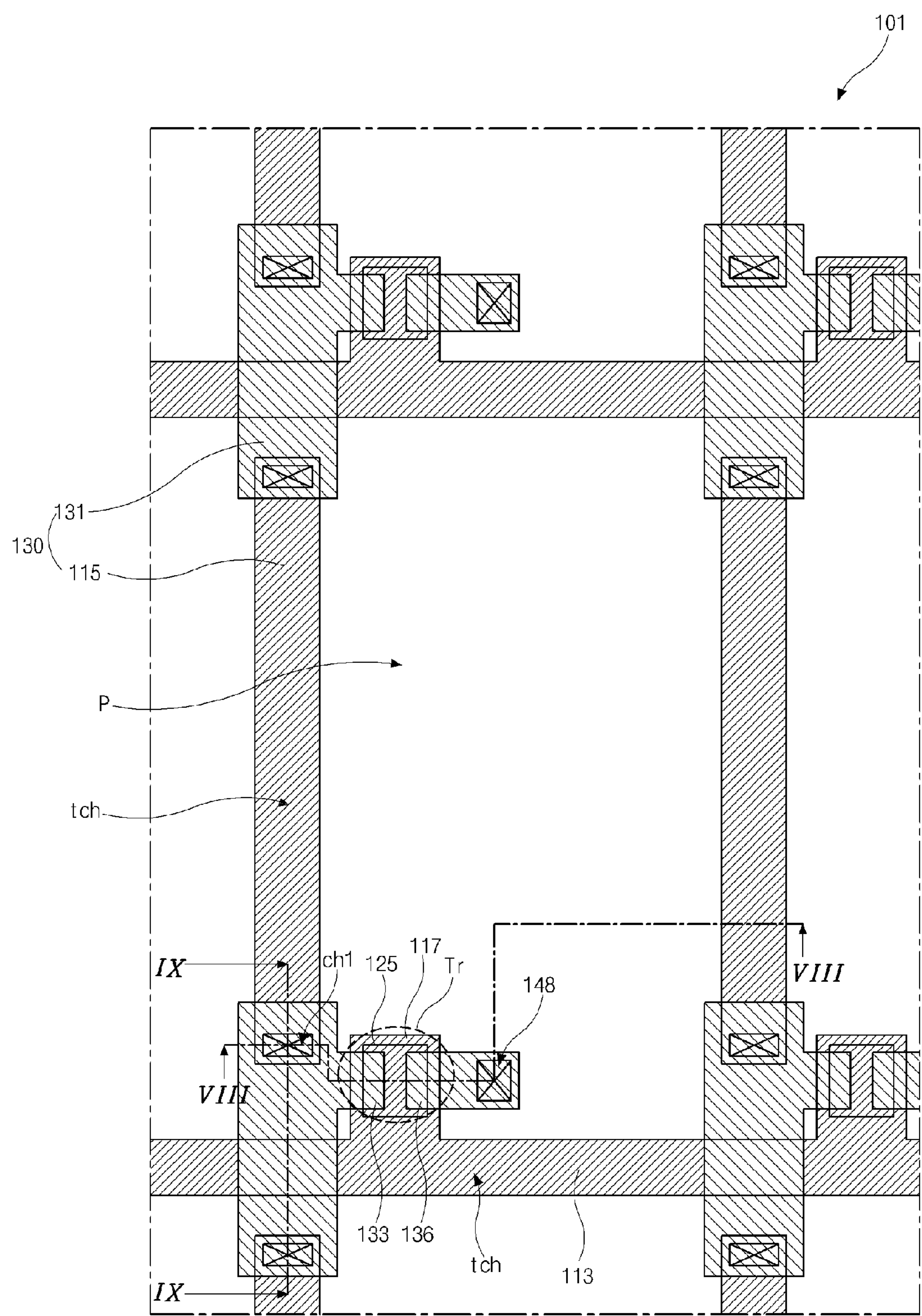
Figure 8J:
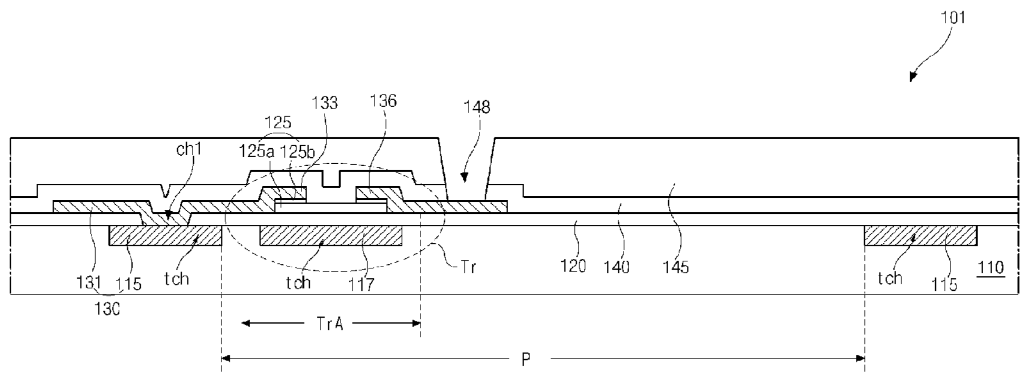
Figure 9J:
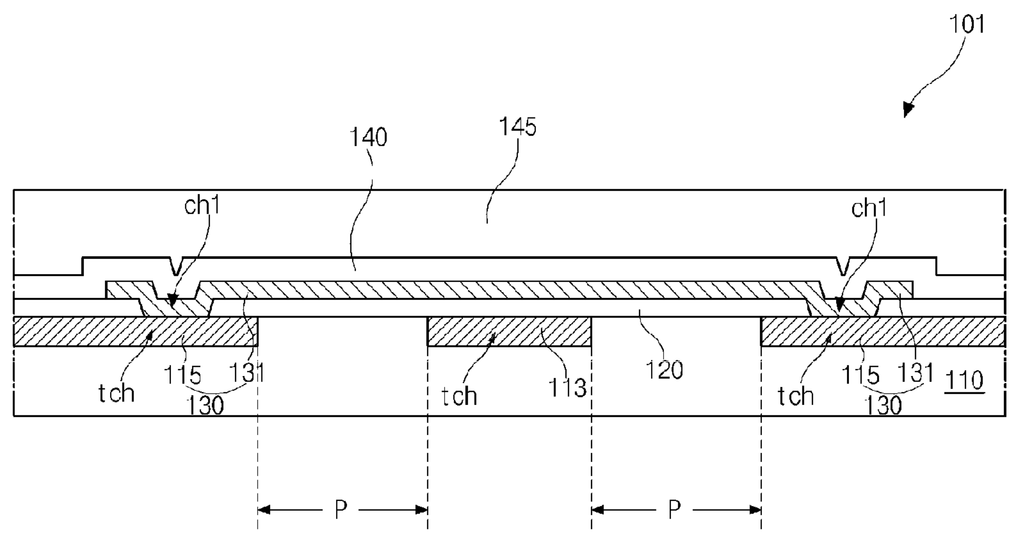

Referring to FIGS. 7F, 8J and 9J, a first passivation layer 140 is formed on the substrate 110 having the source and drain electrodes 133 and 136, and then a second passivation layer 145 is formed on the first passivation layer 140. The first passivation layer 140 may be made of inorganic insulating material, for example, silicon oxide ($SiO_2$) or silicon nitride (SiNx), and the second passivation layer 145 may be made of organic insulating material, for example, photo acryl.

A mask process is performed for the first and second passivation layer 140 and 145 to form a drain contact hole 148 exposing the drain electrode 136.

Figure 7G:
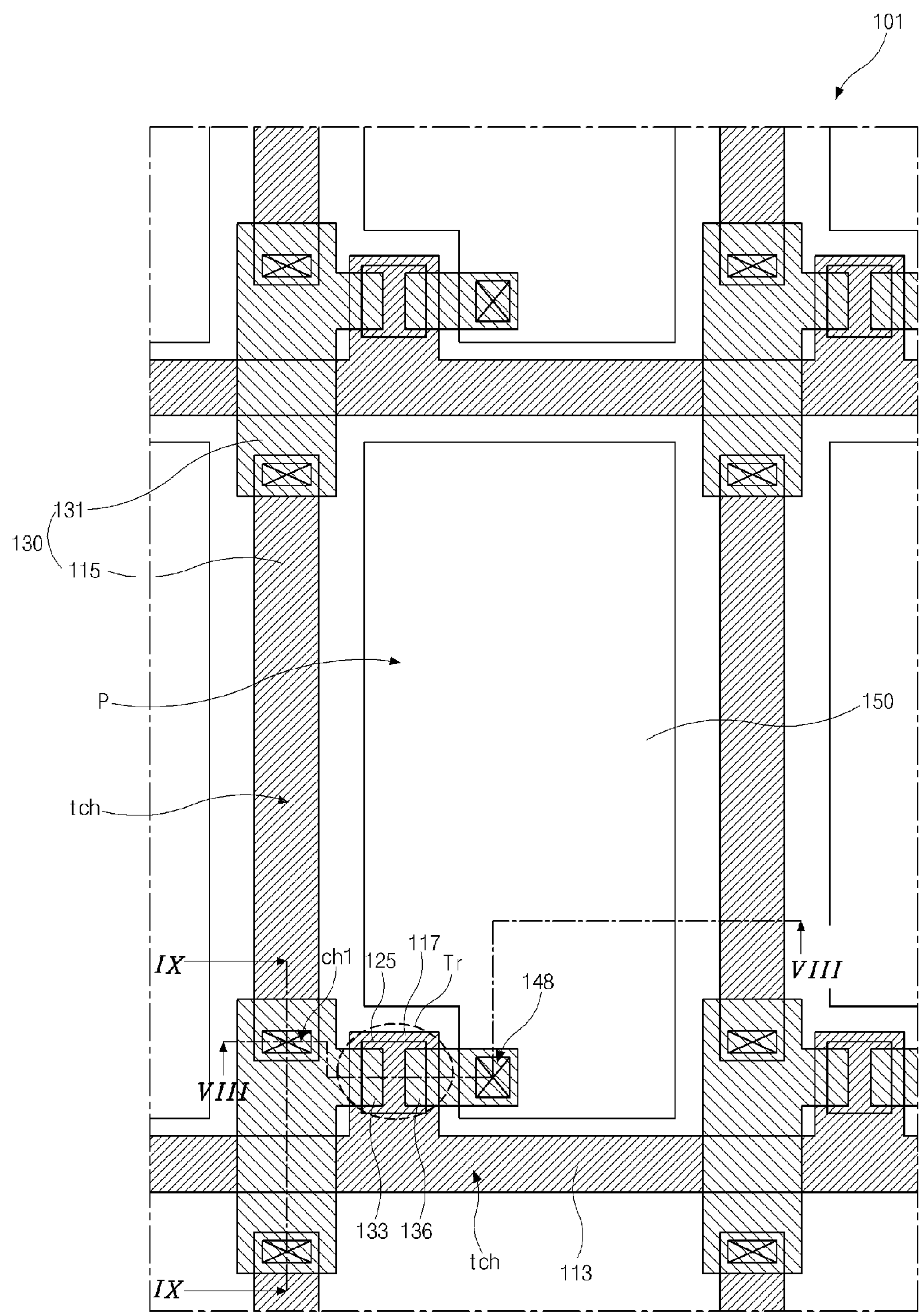
Figure 8K:
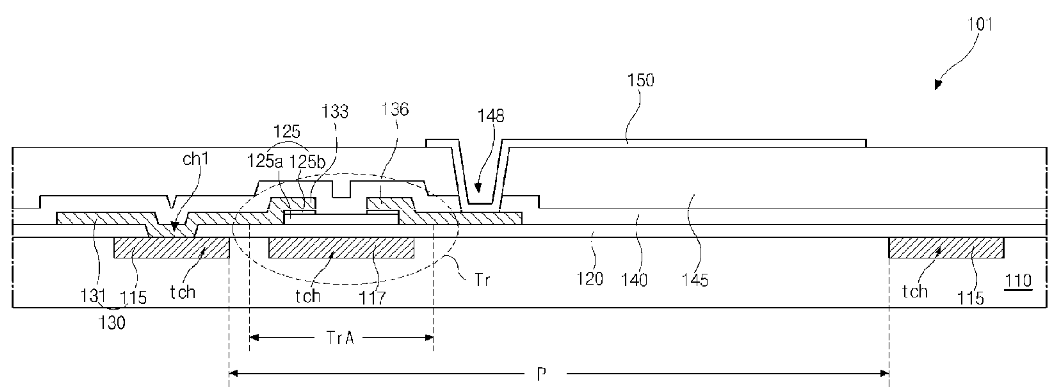
Figure 9K:
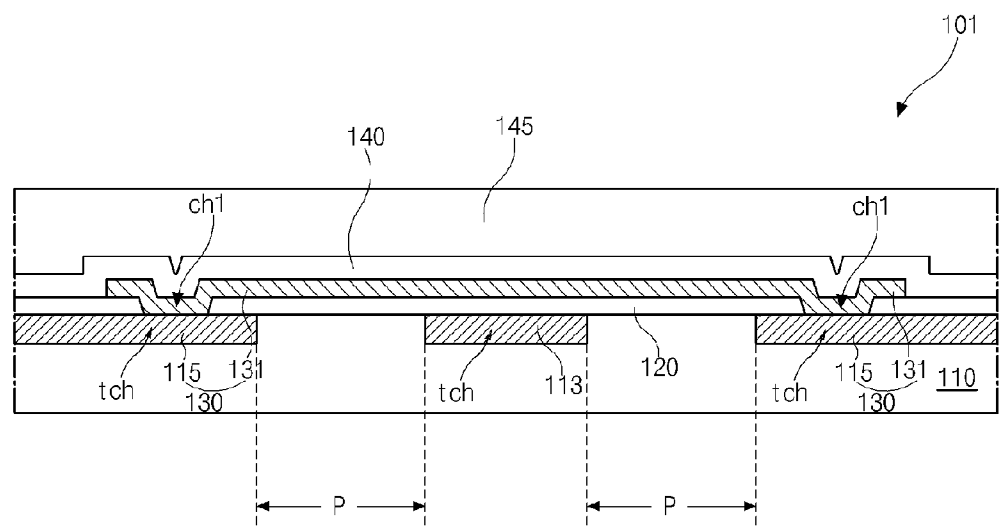

Referring to FIGS. 7G, 8K and 9K, a transparent conductive material layer is formed on the second passivation layer 145 and patterned in a mask process to form a pixel electrode 150 in the pixel region P. The pixel electrode 150 contacts the drain electrode 136 through the drain contact hole 148.

However, the passivation layers can be omitted. And in this case, the transparent conductive material layer can be formed on, e.g., drain electrode 136 and patterned in a mask process to form a pixel electrode 150 in the pixel region P. The pixel electrode 150 is connected to the drain electrode 136.

Through the above-described processes, the array substrate 101 can be fabricated. The array substrate 101 as above may be used for a twisted nematic mode LCD.

Alternatively, the pixel electrode 150 is formed to have a plurality of bars in the pixel region and a common electrode may be formed, in the same process of forming the pixel electrode 150, to have a plurality of another bars alternating with the bars of the pixel electrode 150. The array substrate 110 having such the configuration may be used for an in-plane switching mode LCD.

In case of the array substrate 110 for the in-plane switching mode LCD, a common line may be formed in the process of forming the gate line 113, a common contact hole may be formed in the process of forming the drain contact hole 148 of the passivation layers 140 and 145, and the common electrode may contact the common line through the common contact hole.

Alternatively, after forming the pixel electrode 150, then an insulating layer is formed on the pixel electrode 150, and then a common electrode is formed on the insulating layer to have a plurality of bar-shaped openings over the pixel electrode 150. The array substrate 110 having such the configuration may be used for a fringe field mode LCD.

FIGS. 10A to 10E are cross-sectional views illustrating a method of the array substrate of the LCD according to the second embodiment.

The method of fabricating the array substrate of the second embodiment includes forming a trench in a buffer layer other than a substrate, and the processes after forming the trench in the buffer layer is similar to are similar to those of the first embodiment and explanations thereof may be omitted.

Figure 10A:
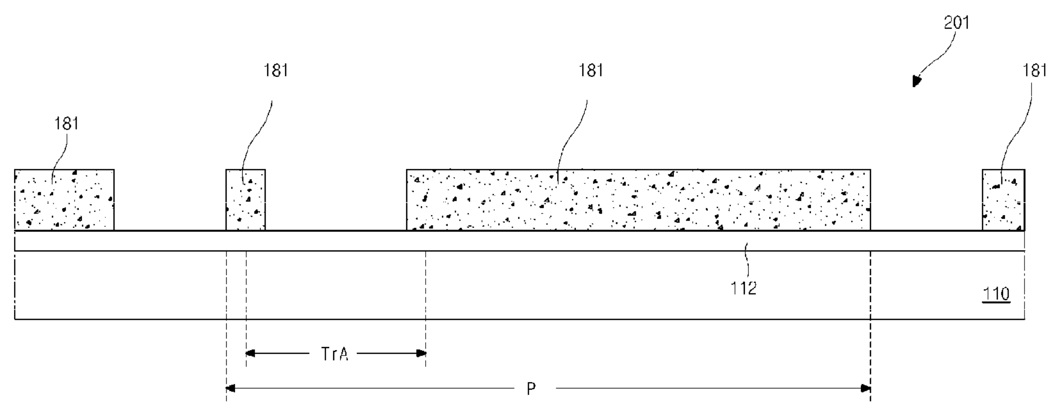
FIGS. 10A to 10E are cross-sectional views illustrating a method of fabricating the array substrate of the LCD according to the second embodiment.

Referring to FIG. 10A, a buffer layer 112 is formed on a substrate 110. The buffer layer 112 may be made of inorganic insulating material, for example, silicon oxide ($SiO_2$) or silicon nitride (SiNx), or organic insulating material, for example, photo acryl, polyimide or polystyrene.

The buffer layer 112 may have a thickness equal to or more than that of a gate line 113, a gate electrode 117 and a data pattern 115 to be formed later.

Then, a photoresist layer is formed on the buffer layer 112 and patterned in a mask process to form a first photoresist pattern 181 at regions except for regions where the gate line 113, the gate electrode 117 and the data pattern 115 are formed. In other words, the first photoresist pattern 181 exposes the regions where the gate line 113, the gate electrode 117 and the data pattern 115 are formed.

Figure 10B:
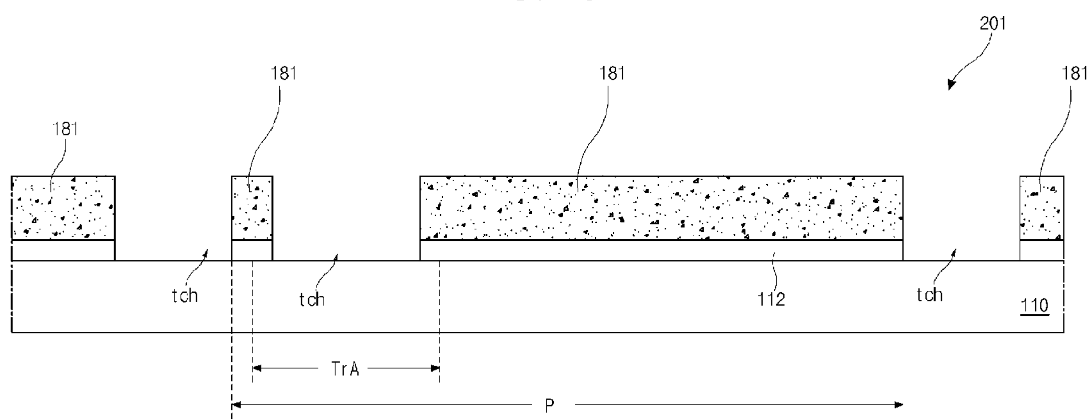

Referring to FIG. 10B, the buffer layer 112 is etched using the first photoresist pattern 181 as an etching mask to form a trench tch. The trench tch may have a depth about 0.5 μm to 5 μm. The trench tch may expose the substrate 110 by completely removing the buffer layer 112 or may not expose the substrate 110 by partially removing the buffer layer 112.

Figure 10C:
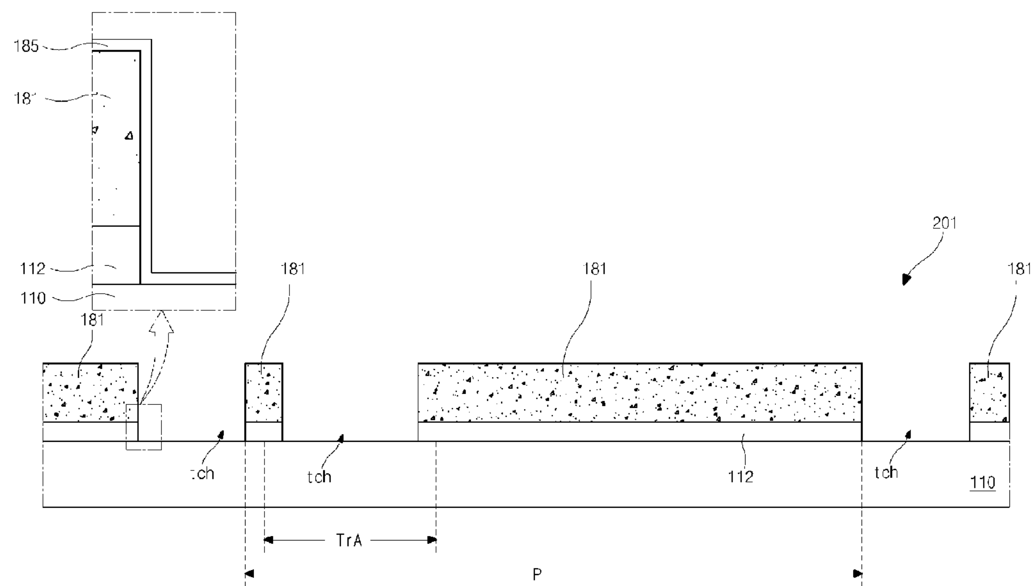

Referring to FIG. 10C, a catalytic layer 185 is formed entirely on the first photoresist pattern 181 and in the trench tch. For example, the catalytic layer 185 may be made of palladium (Pd) group material, and may be formed by coating Pd—Sn colloid or depositing Pd ion (e.g., $Pd^{2+}$).

Figure 10D:
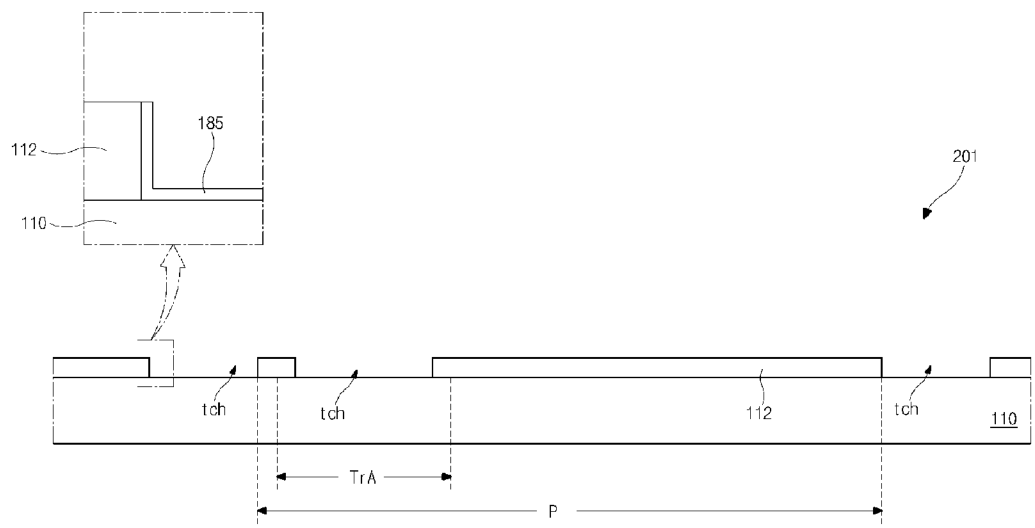

Referring to FIG. 10D, a stripping process is performed to remove the first photoresist layer 181.

Accordingly, the catalytic layer 185 on the first photoresist pattern 181 is removed, and thus the catalytic layer 185 remains on an inner surface of the trench tch, and the surface of the buffer layer 112 outside the trench tch is exposed without the catalytic layer 185 thereon.

Figure 10E:
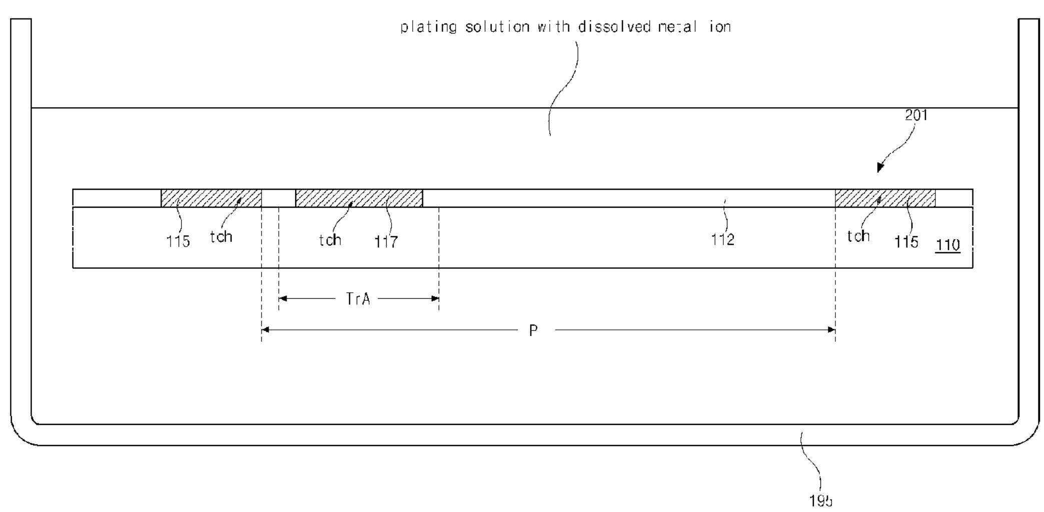

Referring to FIGS. 10E, the substrate 110 having the catalytic layer 185 in the trench tch is immersed in a tank 195 containing a plating solution in which at least one metal material of low resistance, for example, at least one of aluminum (Al), aluminum alloy, copper and copper alloy ion is dissolved, and electroless plating is performed.

Through the electroless plating, metal ion is selectively plated in the trench tch having the catalytic layer 185 therein but is not plated on the surface of the buffer layer 112 not having the catalytic layer 185.

Accordingly, when the electroless plating is finished, the gate line 113, the gate electrode 117 and the data pattern 115 are formed filling the corresponding trenches tch.

The post processes may be described with reference to the method of the first embodiment.

As described above, because of the trench tch, the array substrate 101 can use the gate line and the data line several times to tens of times thicker than those of the related art. Accordingly, even when display area increases and the signal line becomes longer, thickness increases and thus resistance is reduced. Therefore, signal delay can be prevented.

Moreover, even when the thickness of the gate line and the data line increases, a step portion due to this is not produced. Accordingly, disconnection of a component over the signal line or a vacant space near the signal line due to the step portion is prevented. Therefore, product defect rate and production cost can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate comprising:

a substrate including a pixel region;

trenches formed in the substrate and having a depth from a surface of the substrate;

a gate line, a gate electrode and a data pattern filling at least two of the trenches, wherein the data pattern is between adjacent gate lines;

a gate insulating layer on the gate line, the gate electrode and the data pattern, substantially flat over the substrate, and including contact holes that expose ends of the data pattern;

a semiconductor layer on the gate insulating layer over the gate electrode;

a data connection portion on the gate insulating layer and contacting adjacent data patterns through the contact holes;

a source electrode connected to the data connection portion, and a drain electrode spaced apart from the source electrode;

a pixel electrode connected to the drain electrode; and a passivation layer on the source and drain electrodes and including a drain contact hole exposing the drain electrode, wherein the pixel electrode is on the passivation layer and contacts the drain electrode through the drain contact hole, and wherein the source electrode extends from the data connection portion and on the semiconductor layer.

2. The array substrate according to claim 1, wherein the depth of the trenches is about 0.5 μm to about 5 μm, and the gate line, the gate electrode and the data pattern have a thickness equal to the depth.

3. An array substrate comprising:

a substrate including a pixel region;

a buffer layer on the substrate and including trenches having a depth from a surface of the buffer layer;

a gate line, a gate electrode and a data pattern filling at least two of the trenches, wherein the data pattern is between adjacent gate lines;

a gate insulating layer over the buffer layer on the gate line, the gate electrode and the data pattern, substantially flat over the substrate, and including contact holes that expose both ends of the data pattern;

a semiconductor layer on the gate insulating layer over the gate electrode;

a data connection portion on the gate insulating layer and contacting adjacent data patterns through the contact holes;

a source electrode connected to the data connection portion, and a drain electrode spaced apart from the source electrode; and a pixel electrode connected to the drain electrode.

4. The array substrate according to claim 3, further comprising:

a passivation layer on the source and drain electrodes and including a drain contact hole exposing the drain electrode, wherein the pixel electrode is on the passivation layer and contacts the drain electrode through the drain contact hole, and wherein the source electrode extends from the data connection portion and on the semiconductor layer.

5. The array substrate according to claim 3, wherein the depth of the trenches is 0.5 μm to 5 μm, and the gate line, the gate electrode and the data pattern have a thickness that is the same as the depth.

6. The array substrate according to claim 3, wherein the depth of the trenches is equal to or less than a thickness of the buffer layer.

7. A method of fabricating an array substrate comprising:

etching a substrate including a pixel region to form trenches in the substrate and having a depth from a surface of the substrate;

forming a gate line, a gate electrode and a data pattern filling at least two of the trenches, wherein the data pattern is between adjacent gate lines;

forming a gate insulating layer on the gate line, the gate electrode and the data pattern, the gate insulating layer being substantially flat over the substrate;

forming a semiconductor layer on the gate insulating layer over the gate electrode;

patterning the gate insulating layer to form contact holes that expose ends of the data pattern;

forming a data connection portion on the gate insulating layer, the data connection portion contacting adjacent data patterns through the contact holes, a source electrode connected to the data connection portion, and a drain electrode spaced apart from the source electrode;

after forming the data connection portion on the gate insulating layer, forming a passivation layer on the source and drain electrodes, the passivation layer including a drain contact hole exposing the drain electrode; and forming a pixel electrode connected to the drain electrode, wherein the pixel electrode is on the passivation layer and contacts the drain electrode through the drain contact hole, and wherein the source electrode extends from the data connection portion and on the semiconductor layer.

8. The method according to claim 7, wherein etching the substrate including the pixel region to form the trenches in the substrate and having the depth from a surface of the substrate, and forming the gate line, the gate electrode and the data pattern filling the at least two trenches comprises:

forming a photoresist pattern on the substrate and exposing a portion corresponding to the trenches;

etching the substrate using the photoresist pattern to form the trenches;

forming a catalytic layer on the trenches and the photoresist pattern;

removing the photoresist pattern, whereby the catalytic layer remains in the trenches; and immersing the substrate having the catalytic layer remaining in the trenches into a plating solution in which a metal material is dissolved and performing an electroless plating, thereby plating the metal material in the trenches.

9. The method according to claim 7, wherein the depth of the trenches is 0.5 μm to 5 μm.

10. The method according to claim 8, wherein the catalytic layer is formed by coating Pd-Sn colloid or depositing Pd ion.

11. A method of fabricating an array substrate comprising:

forming a buffer layer on a substrate including a pixel region;

etching the buffer layer to form trenches in the buffer layer and having a depth from a surface of the buffer layer;

forming a gate line, a gate electrode and a data pattern filling at least two of the trenches, wherein the data pattern is between adjacent gate lines;

forming a gate insulating layer over the buffer layer on the gate line, the gate electrode and the data pattern, and substantially flat over the substrate;

forming a semiconductor layer on the gate insulating layer over the gate electrode;

patterning the gate insulating layer to form contact holes that expose ends of the data pattern;

forming a data connection portion on the gate insulating layer, which contacts adjacent data patterns through the contact holes, a source electrode connected to the data connection portion, and a drain electrode spaced apart from the source electrode; and forming a pixel electrode connected to the drain electrode.

12. The method according to claim 11, further comprising:

after forming the data connection portion on the gate insulating layer, forming a passivation layer on the source and drain electrodes, the passivation layer including a drain contact hole exposing the drain electrode, wherein the pixel electrode is on the passivation layer and contacts the drain electrode through the drain contact hole, and wherein the source electrode extends from the data connection portion and on the semiconductor layer.

13. The method according to claim 11, wherein etching the buffer layer to form the trenches in the buffer layer and having the depth from a surface of the buffer layer, and forming the gate line, the gate electrode and the data pattern filling the at least two trenches comprises:

forming a photoresist pattern on the buffer layer which exposes a portion corresponding to the trenches;

etching the buffer layer using the photoresist pattern to form the trenches;

forming a catalytic layer on the trenches and the photoresist pattern;

removing the photoresist pattern, whereby the catalytic layer remains in the trenches; and immersing the substrate having the catalytic layer remaining in the trenches into a plating solution in which a metal material is dissolved and performing an electroless plating, thereby plating the metal material in the trenches.

14. The method according to claim 13, wherein the catalytic layer is formed by coating Pd-Sn colloid or depositing Pd ion.

15. The method according to claim 11, wherein the depth of the trenches is equal to or less than a thickness of the buffer layer.

16. The method according to claim 11, wherein the depth of the trenches is 0.5 μm to 5 μm.

* * * * *